United States Patent
Suzuki

(10) Patent No.: US 7,345,470 B2
(45) Date of Patent: Mar. 18, 2008

(54) PROBE CARD AND METHOD FOR TESTING MAGNETIC SENSOR

(75) Inventor: Takashi Suzuki, Shizuoka-ken (JP)

(73) Assignee: Yamaha Corporation, Shizuoka-ken (JP)

( * ) Notice: Subject to any disclaimer, the term of this patent is extended or adjusted under 35 U.S.C. 154(b) by 111 days.

(21) Appl. No.: 11/178,180

(22) Filed: Jul. 8, 2005

(65) Prior Publication Data

US 2006/0049823 A1    Mar. 9, 2006

(30) Foreign Application Priority Data

Jul. 9, 2004    (JP) .............................. 2004-203281

(51) Int. Cl.
*G01R 35/00*    (2006.01)
*G01R 33/00*    (2006.01)

(52) U.S. Cl. ...................... 324/202; 324/262

(58) Field of Classification Search ............... 324/202, 324/210, 212, 235, 244, 258, 260–263, 529, 324/754–762; 365/201
See application file for complete search history.

(56) References Cited

U.S. PATENT DOCUMENTS

| | | | | |
|---|---|---|---|---|
| 5,514,953 A | * | 5/1996 | Schultz et al. ............... | 324/228 |
| 5,668,470 A | * | 9/1997 | Shelor ........................ | 324/202 |
| 5,721,488 A | * | 2/1998 | Sakai et al. ................. | 324/210 |
| 6,380,752 B1 | | 4/2002 | Irino | |
| 6,943,546 B2 | * | 9/2005 | Patland et al. .............. | 324/210 |
| 2006/0284629 A1 | * | 12/2006 | Wei et al. .................... | 324/754 |

FOREIGN PATENT DOCUMENTS

| | | | | |
|---|---|---|---|---|
| JP | 05036805 | * | 2/1983 | |
| JP | 62-055977 A | | 3/1987 | |
| JP | S62-055977 | | 3/1987 | |
| JP | 403180756 | * | 8/1991 | ................ 324/228 |
| JP | 403277980 | * | 12/1991 | ................ 324/252 |
| JP | H09-050601 | | 2/1997 | |
| JP | 11-339231 A | | 12/1999 | |
| JP | 2000-206205 A | | 7/2000 | |

* cited by examiner

*Primary Examiner*—Patrick Assouad
*Assistant Examiner*—Kenneth J Whittington
(74) *Attorney, Agent, or Firm*—Dickstein Shapiro LLP

(57) ABSTRACT

A probe card comprises a plurality of coils for impressing a magnetic field in changeable directions to a magnetic sensor and a group of probes for detecting an output signal of the magnetic sensor. A manufacturing cost of the magnetic sensor can be decreased.

6 Claims, 18 Drawing Sheets

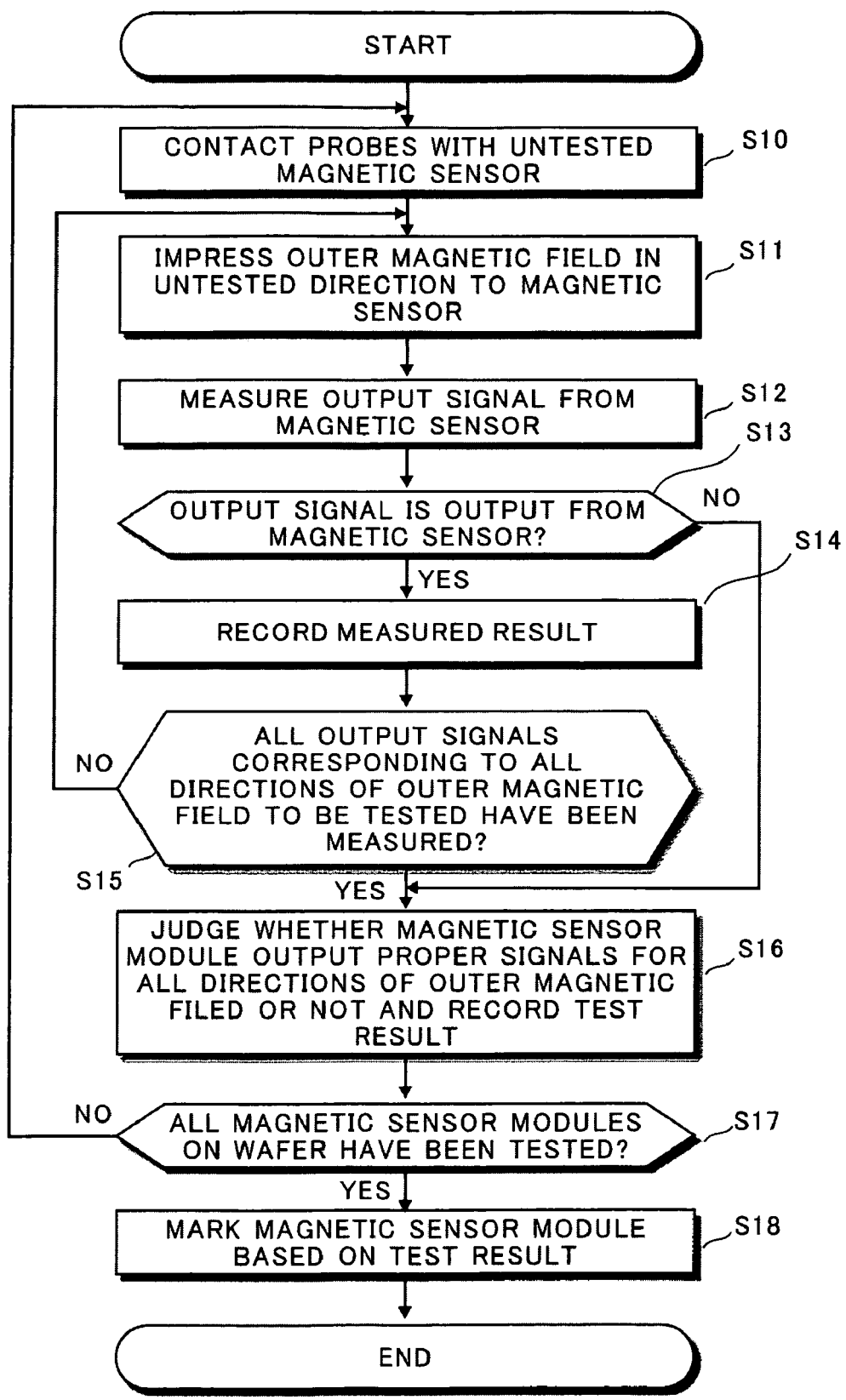

PROBE CARD AND METHOD FOR TESTING MAGNETIC SENSOR

CROSS REFERENCE TO RELATED APPLICATION

This application is based on Japanese Patent application 2004-203281, filed on Jul. 9, 2004, Japanese Patent application No. 2005-202816, and Japanese Patent application No. 2005-205493, the entire contents of which are incorporated herein by reference.

BACKGROUND OF THE INVENTION

A) Field of the Invention

The present invention relates to a probe card and a method for testing a magnetic sensor.

B) Description of the Related Art

Conventionally in a magnetic sensor test, an output signal from a packaged magnetic sensor is measured by placing the sensor into a magnetic field generated by Helmholtz coil or the like (e.g., refer to Japanese Laid-open Patent No. Hei09-50601.

The testing method disclosed in the Japanese Laid-open Patent No. Hei09-50601, a cost for assembling a magnetic sensor may be wasteful if the magnetic sensor is judged as defection because the test is executed after that the magnetic sensor has been packaged.

On the other hand, Japanese Laid-open Patent No.Sho62-55977 discloses a method for testing a magnetic sensor by a testing device having a coil prober as a magnetism generator. In this testing method, an output signal from a magnetic sensor in a wafer is measured by approaching a tip of the coil prober to the magnetic sensor and impressing a magnetic field to the magnetic sensor. Therefore, the magnetic sensor can be tested in a wafer state.

However, the magnetic field generated from the tip of the coil prober is a single direction. Therefore, for testing outputs of the magnetic sensor corresponding to a plurality of directions of outer magnetic fields, the coil prober and the magnetic sensor have to be rotated relatively.

SUMMARY OF THE INVENTION

It is an object of the present invention to provide a probe card that can decrease a manufacturing cost of a magnetic sensor module.

It is another object of the present invention to provide a method for testing a magnetic sensor module that can decrease a manufacturing cost of a magnetic sensor module.

According to one aspect of the present invention, there is provided a probe a probe card, comprising: a plurality of coils for impressing a magnetic field in changeable directions to a magnetic sensor; and a group of probes for detecting an output signal of the magnetic sensor.

According to another aspect of the present invention, there is provided a method for testing a magnetic sensor, comprising the steps of: (a) contacting a probe card to a wafer on which a magnetic sensor is formed; (b) impressing a magnetic field to the magnetic sensor by supplying current to a plurality of coils formed in the probe card; (c) detecting an output signal of the magnetic sensor by the probe card; and (d) changing a direction of the magnetic field impressed to the magnetic sensor by changing the current supplied to the plurality of the coils.

According to still another aspect of the present invention, there is provided a method for testing a magnetic sensor module, comprising the steps of: (a) contacting at least one of magnetic sensor modules formed on a wafer, each magnetic sensor having a magnetic sensor and a digital signal processor, with a probe card having a coil for impressing a magnetic field to the magnetic sensor; (b) testing the digital signal processor by inputting a testing signal to the digital signal processor via the probe card and by obtaining a response signal corresponding to the testing signal from the digital signal processor via the probe card; (c) testing the magnetic sensor by supplying current to the coil for impressing a magnetic field to the magnetic sensor and obtaining a response signal from the magnetic sensor module via the probe card; and (d) separating the magnetic sensor module from the probe card.

According to yet another aspect of the present invention, there is provided a method for testing a magnetic sensor module, comprising the steps of: (a) enclosing a packaged magnetic sensor module having a magnetic sensor and a digital signal processor into a testing socket having a coil for impressing a magnetic field to the magnetic sensor; (b) testing the digital signal processor by inputting a testing signal to the digital signal processor via the testing socket and by obtaining a response signal corresponding to the testing signal from the digital signal processor via the testing socket; (c) testing the magnetic sensor by supplying current to the coil for impressing a magnetic field to the magnetic sensor and obtaining a response signal from the magnetic sensor module via the testing socket; and (d) removing the packaged magnetic sensor module from the testing socket.

BRIEF DESCRIPTION OF THE DRAWINGS

FIG. 6 is a flowchart for testing the magnetic sensor module 300 by the prober 100 equipped with the probe card 130.

DETAILED DESCRIPTION OF THE PREFERRED EMBODIMENTS

Figure 1:
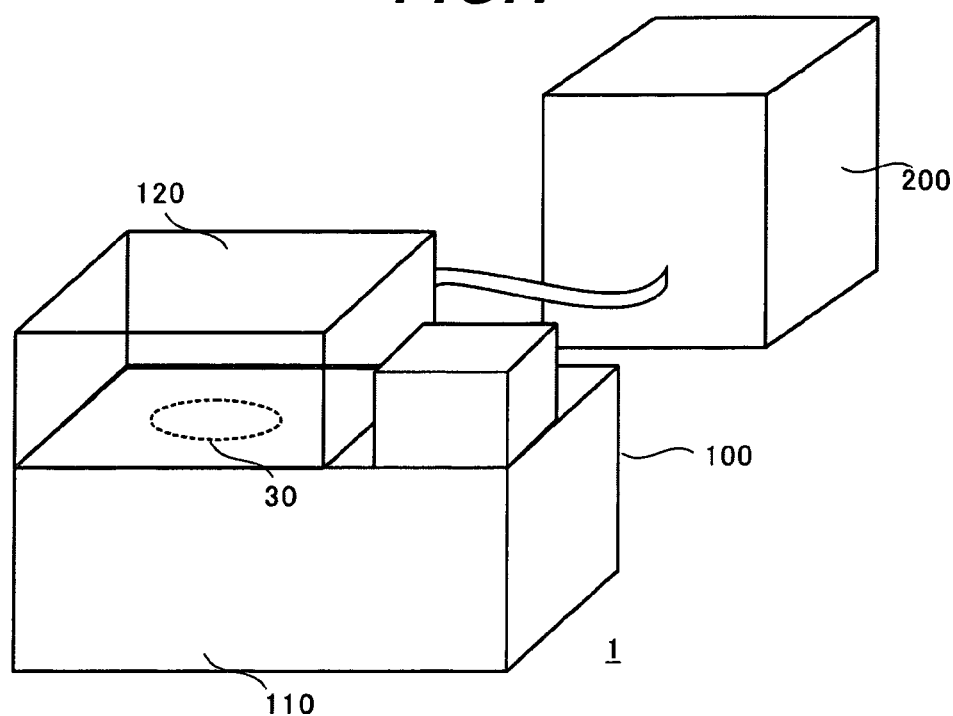
FIG. 1 is a schematic diagram showing a testing system according to a first embodiment of the present invention.

FIG. 1 is a schematic diagram showing a testing system according to a first embodiment of the present invention.

The testing system 1 according to the fourth embodiment of the present invention has a prober 100, a main body 200 of the tester, etc. and tests a magnetic sensor module formed in the wafer 30.

Figure 2:
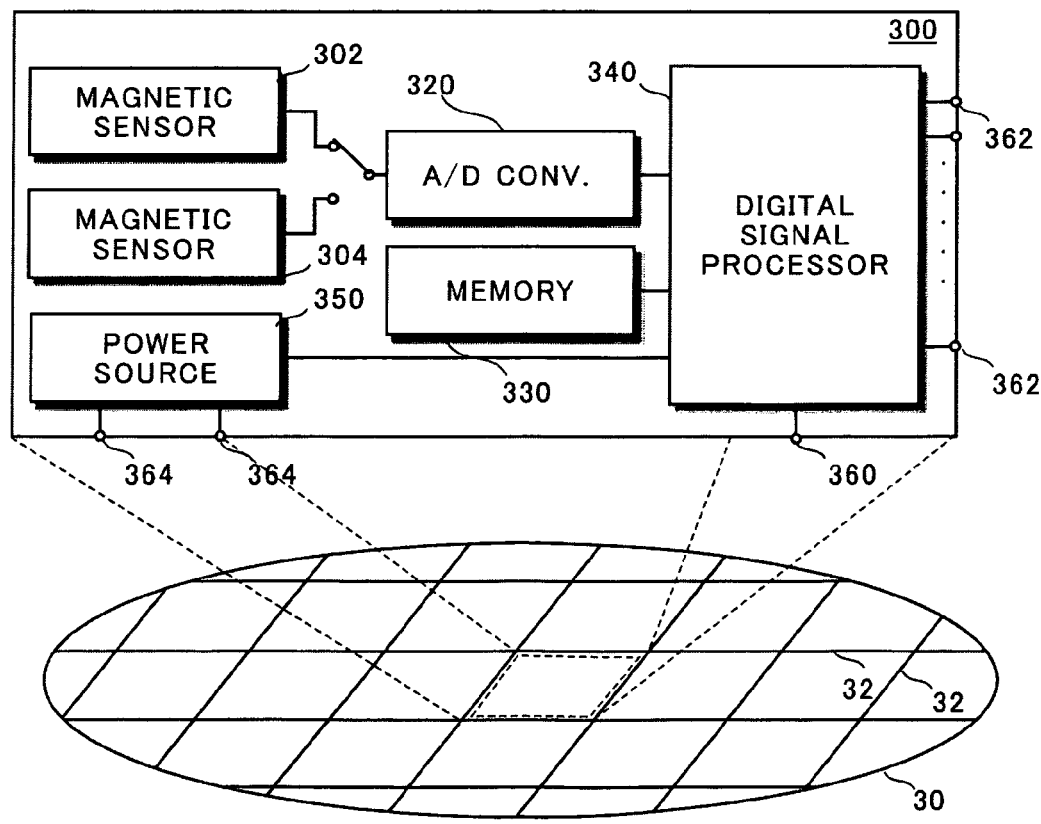
FIG. 2 is a schematic diagram for explaining the magnetic sensor module 300 to be tested by the testing system 1 according to the first embodiment of the present invention.

FIG. 2 is a schematic diagram for explaining the magnetic sensor module 300 to be tested by the testing system 1 according to the first embodiment of the present invention.

The magnetic sensor module 300 is consisted of a magnetic sensor 302, magnetic sensor 304, an analogue-to-digital converter (hereinafter called the D/A converter) 320, a memory 330, a digital signal processor 340, a power source 350, etc.

The magnetic sensor 302 and the magnetic sensor 304 output analogue signals corresponding to outer magnetic fields, and their sensing directions are crossing at a right angle. Further, the magnetic sensor module may have only one magnetic sensor or more than two magnetic sensors. Hereinafter, the magnetic sensor 302 and the magnetic sensor 304 will be collectively called the magnetic sensors.

The A/D converter 320 converts the analogue signals output from the magnetic sensors to digital signals.

The memory 330 as a storage device is a nonvolatile memory for storing various data such as a correction value and temperature compensation value of the magnetic sensors, etc.

The digital signal processor 340 synchronizes with a clock signal input to a terminal 360 and executes various signal processing. For example, the digital signal processor 340 generates a signal representing a direction of the outer magnetic field (hereinafter called the angle signal) in accordance with magnetic sensors outputs, the correction value and temperature compensation value stored in the memory 330, etc. In addition to that, the digital signal processor 340 outputs the angle signal to a terminal 362, writes the various data in to the memory 330 and reads the various data from the memory 330.

The power source 350 supplies power to each component of the magnetic sensor module 300 by voltage impressed to a terminal 364 as an input. Hereinafter, the terminals 360 to 364 will be collectively called the terminals.

As shown in FIG. 1, the prober 100 is consisted of a main body 110 of the prober, etc. The wafer 30 is attached to the main body 110, and a probe card is attached to a test station 120 placed on the main body 110 and connected to the tester main body 200.

Figure 3:
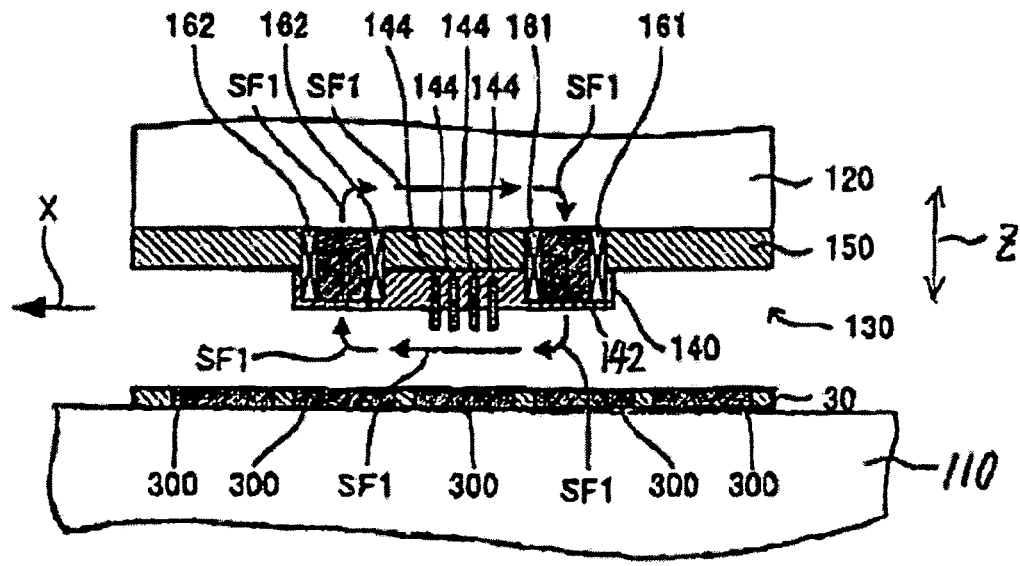
FIG. 3 is an enlarged diagram showing a peripheral of the probe card at the time of the test.
Figure 4:
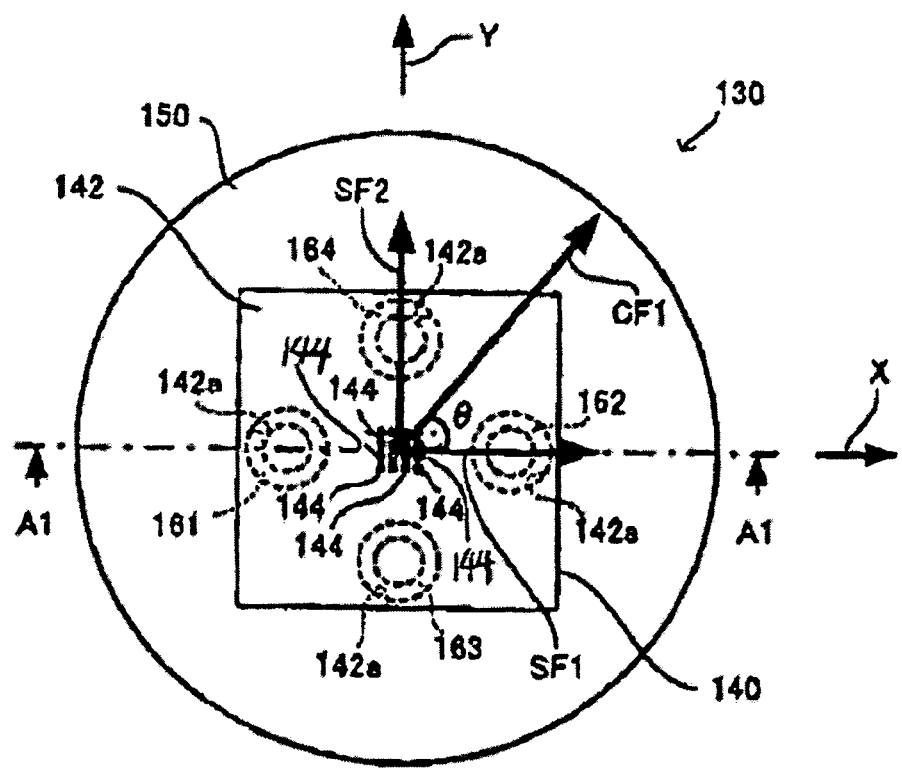
FIG. 4 is a plan view showing the probe card.

FIG. 3 is an enlarged diagram showing a peripheral of the probe card at the time of the test. FIG. 4 is a plan view showing the probe card.

As shown in FIG. 3, the test station 120 changes its relative position to the main body 110 of the prober to a direction that the probe card 130 comes closer to the wafer 30 and to a direction that the probe card 130 goes far from the wafer 30. Hereinafter the embodiment will be explained with assuming that the main body 110 goes up and down (refer to an arrow Z) toward the test station 120 of the prober.

Figure 5A:
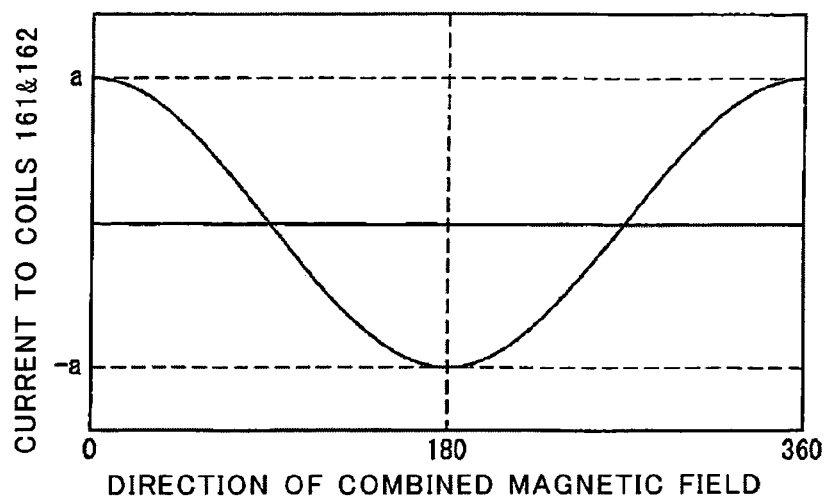
FIG. 5A to FIG. 5C are graphs for explaining relation ship of supplied current to the coils and the combined magnetic field.
Figure 5B:
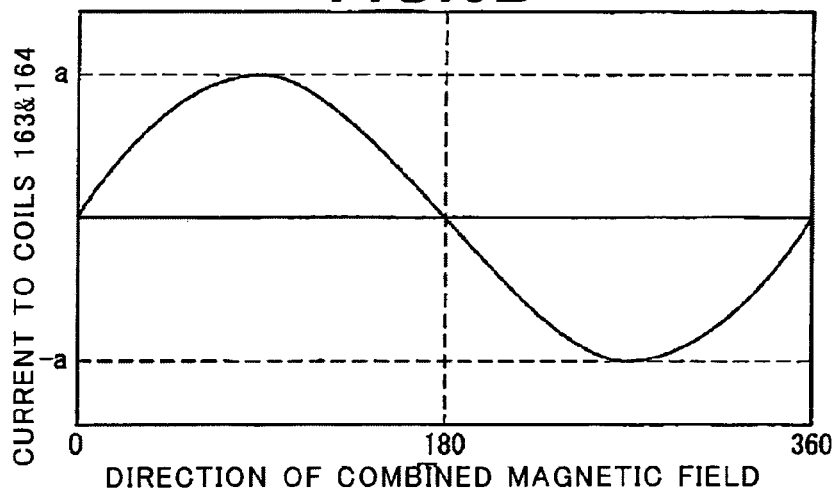

The probe card 130 is consisted of a probe head 140, a printed wiring board 150, coils 161 to 164 (FIG. 4), etc. The probe card 130 is to be attached to a testing device (prober) 100 for testing an electrical property of an integrated circuit, etc. formed on a wafer. The prober 100 equipped with the probe card 130 can measure an output signal of the magnetic sensor module (magnetic sensor chip) 300 formed on the wafer 30 corresponding to an outer magnetic field as shown in FIG. 5. The probe card 130 can arbitrarily control a direction of a magnetic field near tips of the later-described probes (input/output terminals) 144; therefore, it is useful especially for testing a magnetic sensor of which output signal varies depending on a direction of an outer magnetic field such as a compass sensor.

The printed wiring board 150 is fixed to the test station 120 and electrically connects with the main body 200 of the tester via the test station 120.

The probe head 140 has a base 142 and a multiplicity of the probes 144 and is fixed to the printed wiring board 150. The probes 144 are positioned in the center of the base 142. One edge of each probe 144 is projecting vertically from a surface of the base 142 that is opposite side of the printed wiring board 150. A tip of each probe 144 projecting from the base 142 contacts with the terminal of the magnetic sensor module 300 at the time of testing the magnetic sensor module 300. The probes 144 may be positioned in an area other than the center of the base 142.

The coils 161 to 164 are fixed to the probe head 140. For example, the coils 161, 162, 163 and 164 pierce through the printed wiring board 150 and are fixed by being inlaid into four concaves 142a of which bottoms are formed on the base 142. As shown in FIG. 4, the coils 161 and 162 are positioned via the probes 144 to be symmetric with respect to the center of the base 142. Similarly, the coils 163 and 164 are positioned via the probes 144 to be symmetric with respect to the center of the base 142. The coils 161 and 162 are arranged in the position where the coils 163 and 164 are rotated by 90 degrees by setting the center of the base 142 as a rotation center. Hereinafter, a direction from the coil 161 to the coil 162 will be called the X-direction (refer to an arrow X in the drawing), and a direction from the coil 163 to the coil 164 will be called the Y-direction (refer to an arrow Y in the drawing). Further, the coils 161 to 164 may be inlaid into the concave parts 142a by a structure other than that shown in the drawing. Although the coils 161 to 164 are inlaid into the concave parts 142a in the above-described embodiment, a method for fixing the coils is not limited to that. Moreover, magnetic material such as ferrite, permalloy etc., or core material may be placed in the centers of the coils 161 to 164. In this case, a large magnetic-field can be generated by small current.

The coil 161 and the coil 162 are electrically connected serially for generating a magnetic field directing vice versa inside the coils. When currents are supplied to the coils 161 and 162, the magnetic field SF1 of which part near the tips of the probes 144 is directing toward the X-direction (or an opposite direction of the X-direction) will be generated. Similarly, the coil 163 and the coil 164 are electrically connected serially for generating a magnetic field directing vice versa inside the coils. When currents are supplied to the coils 163 and 164, the magnetic field SF2 of which part near the tips of the probes 144 is directing toward the Y-direction (or an opposite direction of the Y-direction) will be generated. That is, by supplying the current to the coils 161 to 164, the magnetic field SF1 and the magnetic field SF2 of which directions are crossing at a right angle near the tips of the probes 144.

Under a condition that the magnetic fields SF1 and SF2 have been generated, the combined magnetic field CF1 of the magnetic fields SF1 and SF2 is generated near the tips of the probes 144. A size of the combined magnetic field CF1 and a direction of the combined magnetic field CF1 near the tips of the probes 144 can be arbitrarily controlled by controlling sizes and directions of the magnetic fields SF1 and SF2. The size of the magnetic field SF1 can be controlled by intensities of the current supplied to the coils 161 and 162, and the direction of the magnetic field SF1 can be controlled by the directions of current supplied to the coils 161 and 162. Similarly, the size and the direction of the magnetic field SF2 can be controlled by controlling intensities and directions of the current supplied to the coils 163 and 164.

For example, in order to generate the combined magnetic field CF1 of which part near the tips of the probes 144 is directing toward a direction at an angle θ with the X-direction, the current (I1: refer to FIG. 5A) represented by the following equation (1) is supplied to the coils 161 and 162, and the current (I2: refer to FIG. 5B) represented by the following equation (2) is supplied to the coils 163 and 164. In the equations (1) and (2), absolute values of I1 and I2 respectively represent intensities of current supplied to the coil 161 (coil 162) and the coil 163 (coil 164), and signs of I1 and I2 respectively represent directions of current supplied to the coil 161 (coil 162) and the coil 163 (coil 164). Hereinafter, the direction of the combined magnetic field CF1 will be represented by the angle at the X-direction (refer to the arrow X).

$$I1 = a \cos \theta \tag{1}$$

$$I2 = a \sin \theta \tag{2}$$

Figure 5C:
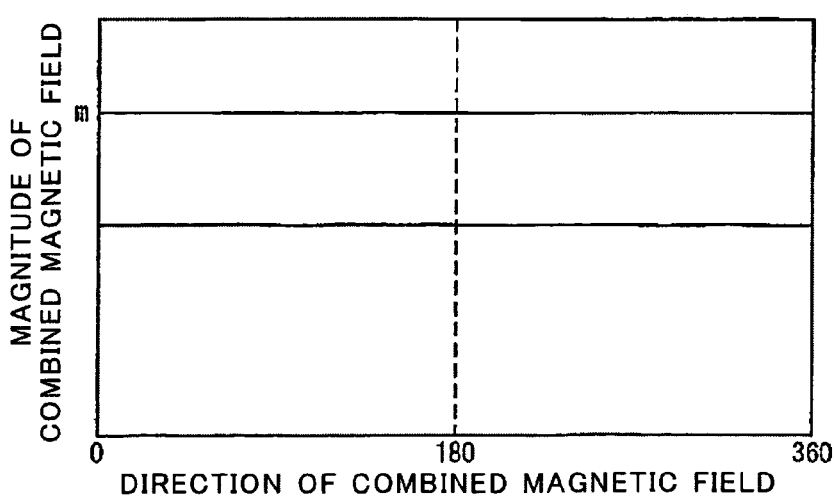

As described above, the combined magnetic field CF1 of which part near the tips of the probes 144 is in an arbitral direction can be generated (refer to FIG. 5C). Magnitude (m) of the combined magnetic field corresponds to the maximum current value (a), and the relationship therebetween is defined by numbers of turns in windings of the coils 161 to 164, etc. Because the magnetic field SF1 and the magnetic field SF2 are crossing at a right angle, sizes and directions supplied to the coils 161 to 164 can be easily obtained from the size and the direction of the magnetic field near the tips of the probes 144 of the combined magnetic field CF1. Therefore, the coils 161 to 164 are preferably arranged in the above-described arrangement. However, if the magnetic field SF1 and the magnetic field SF2 will not be in parallel, other arrangement of the coils 161 to 164 may be applied.

The main body 200 of the tester (the tester main body) shown in FIG. 1 tests the magnetic sensor module 300 by inputting a testing signal to the magnetic sensor module 300 via the probe card 130, generating magnetic fields in the coils 161 to 164 of the probe card 130, and obtaining a response signal of the magnetic sensor module 300 corresponding to the testing signal.

FIG. 6 is a flowchart for testing the magnetic sensor module 300 by the prober 100 equipped with the probe card 130. This flowchart shows a flow of processes for measuring an output signal output from the magnetic sensor module 300 formed on the wafer 30 in correspondence with the outer magnetic field. In this test, the combined magnetic field CF1 is impressed as the outer magnetic field to the magnetic sensor module 300 as the magnetic sensor. Further, the magnetic sensor may be a hall element or a magnetic resistance element.

At Step S10, the tips of the probes 144 are contacted to electrodes of a magnetic sensor chip 6 that has not been measured.

At Step S11, an outer magnetic field directing to an unmeasured direction is impressed to the magnetic sensor module 300. For example, by controlling the currents supplied to the coil 161 (coil 162) and the coil 163 (coil 164), the combined magnetic field CF1 of which magnetic field near the tips of the probes 144 is directing toward the unmeasured direction. In a case of testing an output signal corresponding to 360 degrees outer magnetic fields at 22.5 degrees interval, the combined magnetic fields CF1 will be generated to be directed to 0 degree, 22.5 degrees, 45.0 degrees . . . 337.5 degrees in order.

Magnitude of the outer magnetic field impressed to the magnetic sensor module 300 is determined in accordance with an object of the test. Therefore, it is preferable that the probe card 130 can generate the combined magnetic field CF1 in a predetermined range of magnitudes. When the combined magnetic field CF1 in a predetermined range of magnitudes can be generated, tests for a plurality for objects can be executed in one occasion, for example, by impressing the combined magnetic fields CF1 in different magnitudes to the magnetic sensor module 300. For example, the predetermined range of magnitudes is magnitude ranging from 0.4 A/m to 4000 A/m. The magnitude of 0.4 A/m is a minimum value with regarding to resolution of a magnetic sensor of presence, and 4000 A/m is a maximum value calculated form magnitude of terrestrial magnetism. Further, the probe card 130 may generate the combined magnetic field CF1 smaller than the magnitude of 0.4 A/m and also larger than the magnitude of 4000 A/m.

At Step S12, the output of the magnetic sensor module 300 is measured. For example, the probes 130 contacting with the electrodes of the magnetic sensor module 300 read the output signal of the magnetic sensor module 300.

At Step S13, whether the output signal is output from the magnetic sensor module 300 or not is judged. When the magnetic sensor module 300 outputs the signal, the process advances to Step S14. When the magnetic sensor module 300 does not output the signal, the magnetic sensor module 300 is regarded as defection, the measuring of the magnetic sensor module 300 is terminated even if an unmeasured direction of the outer magnetic field exists, and an unmeasured magnetic sensor will be tested instead, i.e., the process advances to Step S16. Further, the measurement may be continued if the magnetic sensor module 300 does not output the signal without executing the process at Step S13.

At Step S14, result of the measurement at Step S12 is recorded. For example, data corresponding to the output signal as the result of the measurement is stored in a storage medium such as a memory.

At Step S15, the measurements by all the directions of the outer magnetic fields have been completed or not is judged. If an unmeasured direction of the outer magnetic field exists, the process returns to Step S11. If the measurements by all the directions of the outer magnetic fields have been completed, the process advances to Step S16.

At Step S16, all the output signals from the magnetic sensor module 300 corresponding to all the directions of the outer magnetic fields are proper or not is judged, and the result will be recorded. For example, difference between an ideal output signal from the magnetic sensor module 300 corresponding to each direction of the outer magnetic fields and the measurement result at Step S14 is calculated, and it is judged that the difference is in a predetermined range or not. The judgment rule at Step S16 can be arbitrarily decided.

At Step S17, the test for all the magnetic sensor modules 300 formed on the wafer 30 has been completed or not is judged. If the magnetic sensor module 300 that has not been tested yet exists, the process returns to Step S10. If the test for all the magnetic sensor modules 300 formed on the wafer 30 has been completed, the process advances to Step S18.

At Step S18, the magnetic sensor modules 300 are marked in accordance with the results of the test. For example, the magnetic sensor modules 300 having defection will be marked as defection by printing a predetermined mark at a predetermined position. The marking in accordance with the testing result may be carried out in other way. For example, a predetermined position of the magnetic sensor modules 300 having defection may be scored, or the magnetic sensor modules 300 having no defection will be marked as normal product by printing a predetermined mark at a predetermined position. Moreover, the process at Step S18 may be executed after completing the test for a predetermined number of the wafers 30. In that case, the testing result for the predetermined number of the wafers 30 will be stored in a memory, etc.

By the probe card 130 according to the first embodiment of the present invention, the combined magnetic field CF1 is generated by impressing current to the coils 161 to 164. The output signals from the magnetic sensor modules 300 formed on the wafer 30 corresponding to the outer magnetic field can be measured by impressing the combined magnetic field CF1 as the outer magnetic field to the magnetic sensor modules 300. Because the magnetic sensor modules 300 can be tested before being sealed in packages, a cost for assembling magnetic sensors will not be wasted. Moreover, the testing result can be quickly used in the manufacturing processes.

Furthermore, the direction of the magnetic field near the tips of the probes 144 of the combined magnetic field CF1 can be controlled by controlling the sizes and intensities of currents supplied to the coils 161 to 164. Therefore, the output signals of the magnetic sensor module 300 corresponding to the outer magnetic fields in the plurality of directions can be measured without changing a relative position between the probe card 130 and the wafer 30.

Figure 7:
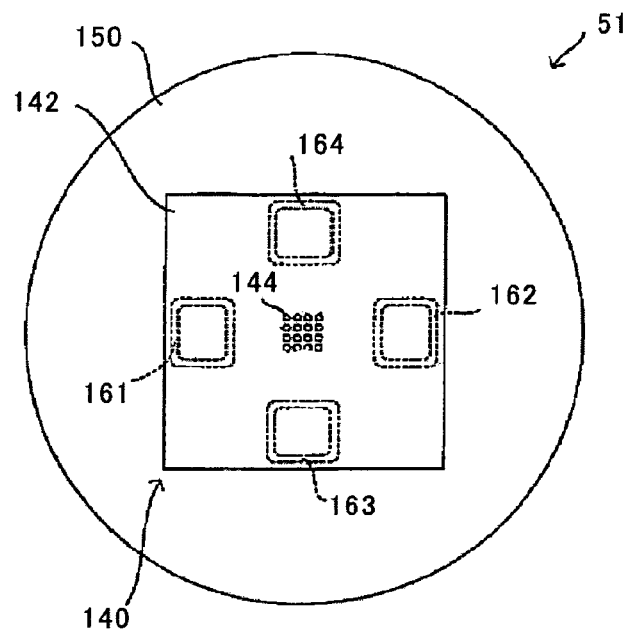
FIG. 7 is a plan view showing the probe card of which coils have rectangle shapes.
Figure 22:
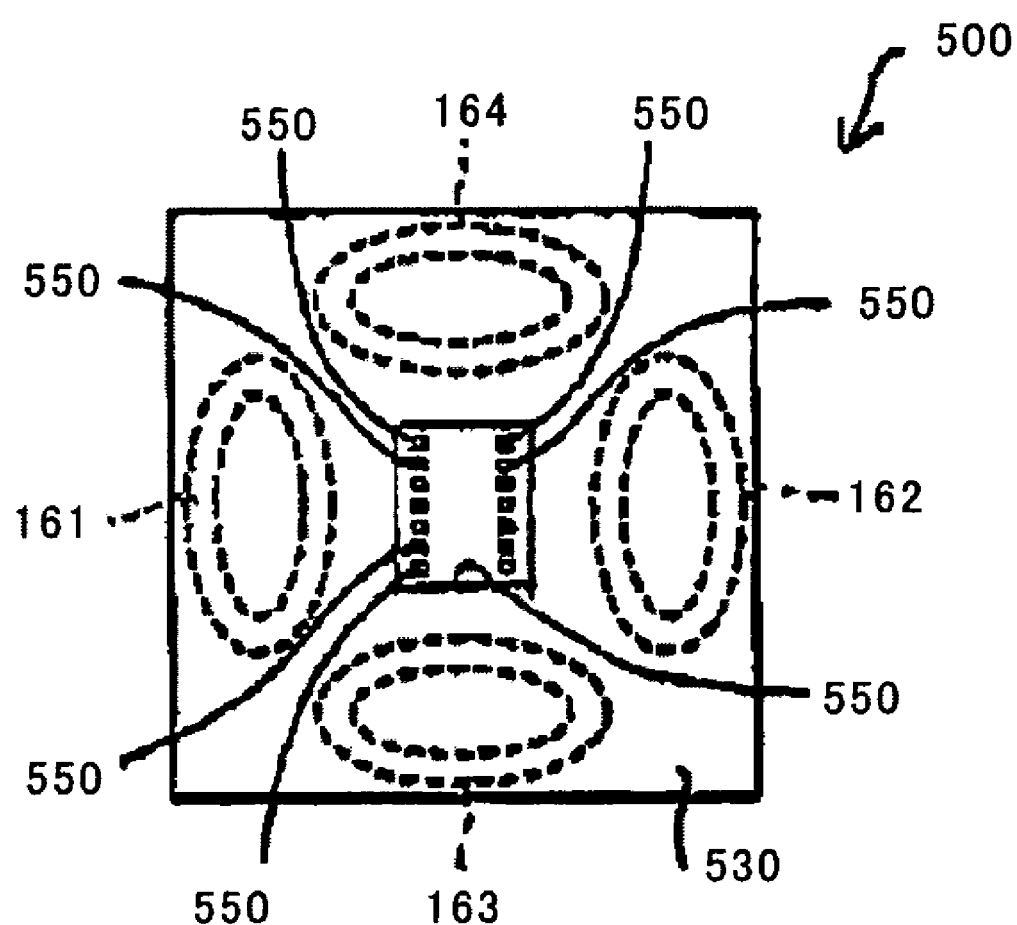
FIG. 22 is a plan view showing the testing socket of which coils have oval shapes.

Although the coils 161 to 164, each having a circle shaped cross section, have been explained in the first embodiment, the shape of the coils is not limited to that. For example, the shape of cross sections of the coils 161 to 164 may be rectangle as shown in a probe card 51 (FIG. 7) or oval (FIG. 22).

Figure 8:
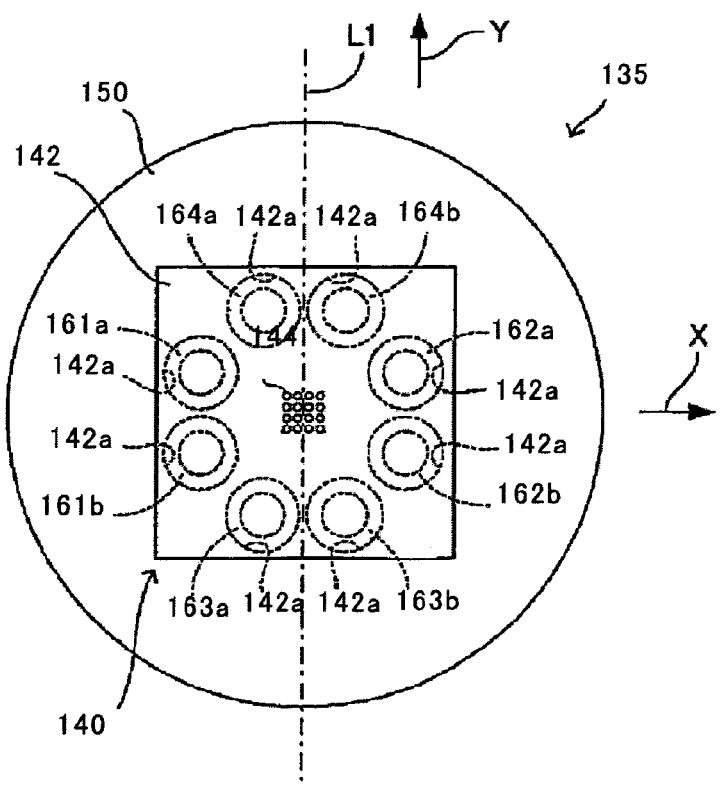
FIG. 8 is a schematic diagram showing a probe card 135 according to a first modified example of the first embodiment of the present invention.

FIG. 8 is a schematic diagram showing a probe card 135 according to a first modified example of the first embodiment of the present invention. The probe card 132 according to the second embodiment has two coils on each of four sides around the probes 144. The components of the modified example similar to the first embodiment are marked with the same reference number as in the first embodiment, and the explanation of those components will be omitted.

The probe card 135 has eight coils, namely the coils 161*a*, 162*a*, 163*a*, 164*a*, 161*b*, 162*b*, 163*b* and 164*b*. The coils 161*a*, 162*a*, 163*a*, 164*a*, 161*b*, 162*b*, 163*b* and 164*b* are inlaid into concave parts 142*a*. The coil 161*a* and the coil 162*a* are positioned via the probes 144 to be symmetric with respect to a virtual straight line L1 passing through the center of the base 142, and the coil 161*b* and 162*b* are positioned similarly. The coil 163*a* and the coil 163*a* are positioned via the probes 144 to be symmetric with respect to a virtual straight line that crosses with the virtual straight line L1 at a right angle, and the coil 163*b* and 164*b* are positioned similarly. Although two coils are positioned each side of the probes 144 in the probe card 135, three or more coils may be positioned on each side of the probes 144.

Similar to the coils 161 and 162 in the first embodiment, the coil 161*a* and the coil 162*a* are electrically connected to each other, and the coil 161*b* and the coil 162*b* are also electrically connected. Similar to the coils 163 and 164 in the first embodiment, the coil 163*a* and the coil 164*a* are electrically connected to each other, and the coil 163*b* and the coil 164*b* are also electrically connected.

Directions of Magnetic fields generated by the coil 161*a* (coil 162*a*) and the coil 161 b (coil 162*b*) near the tips of the probes are the same, and directions of Magnetic fields generated by the coil 163*a* (coil 164*a*) and the coil 163*b* (coil 164*b*) near the tips of the probes are the same. That is, magnetic fluxes parallel to each other pass thorough the magnetic sensor module 300 when the tips of the probes 144 are electrically connected with the electrodes of the magnetic sensor module 300; therefore, the test of the output of the magnetic sensor module 300 corresponding to the outer magnetic field can executed precisely.

Figure 9:
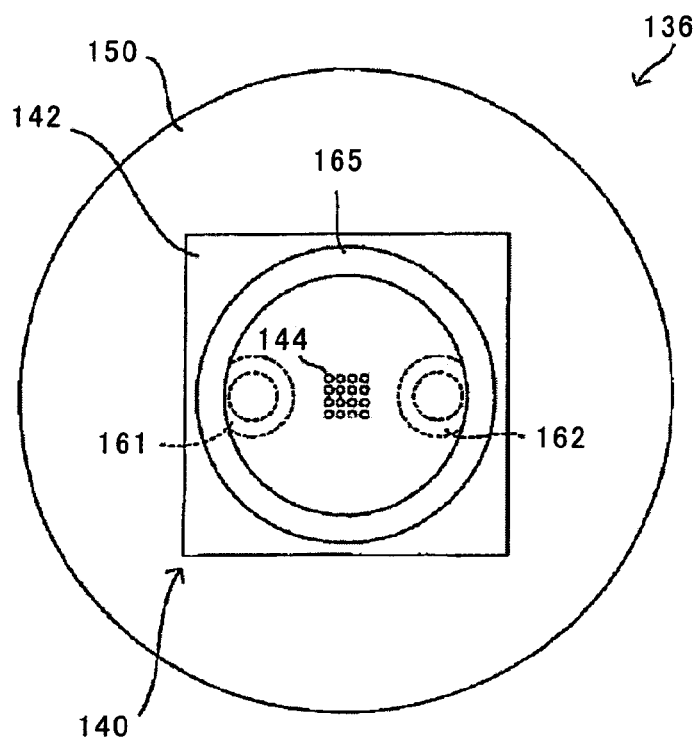
FIG. 9 is a schematic diagram showing a probe card 136 according to a second modified example of the first embodiment of the present invention.
Figure 10:
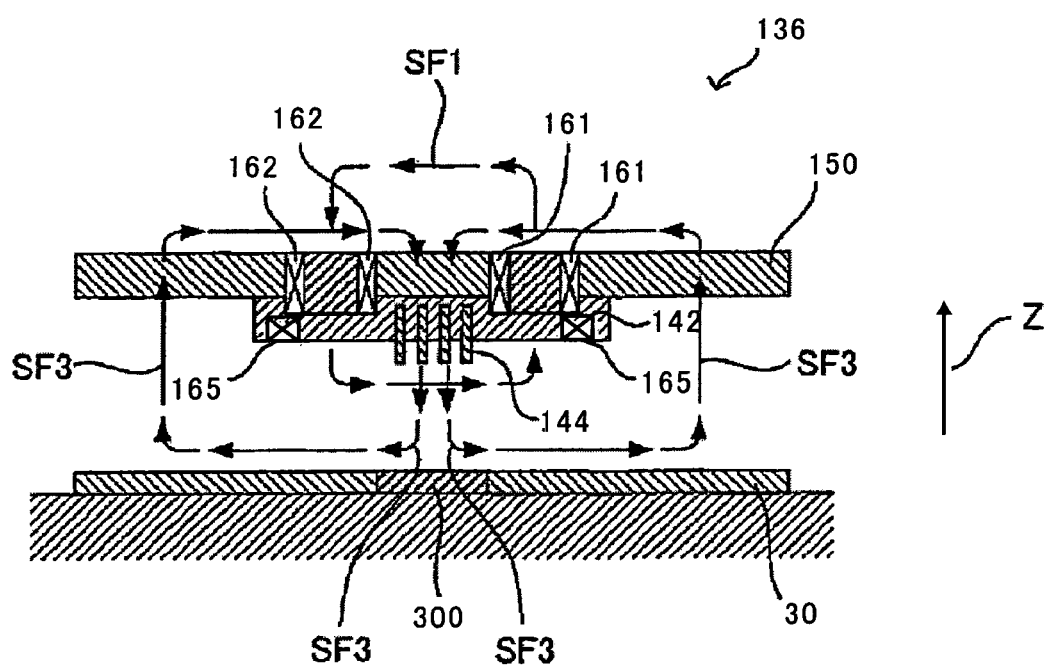
FIG. 10 is a schematic diagram showing a magnetic field SF3 generated by a coil 165 of the probe card 136.

FIG. 9 is a schematic diagram showing a probe card 136 according to a second modified example of the first embodiment of the present invention. FIG. 10 is a schematic diagram showing a magnetic field SF3 generated by a coil 165 of the probe card 136. The probe card 136 according to the third embodiment has the coil 165 generating the magnetic field SF3 that directs vertically with respect to a surface of the base 142. The components of the second modified example similar to the first embodiment are marked with the same reference number as in the first embodiment, and the explanation of those components will be omitted.

Figure 11:
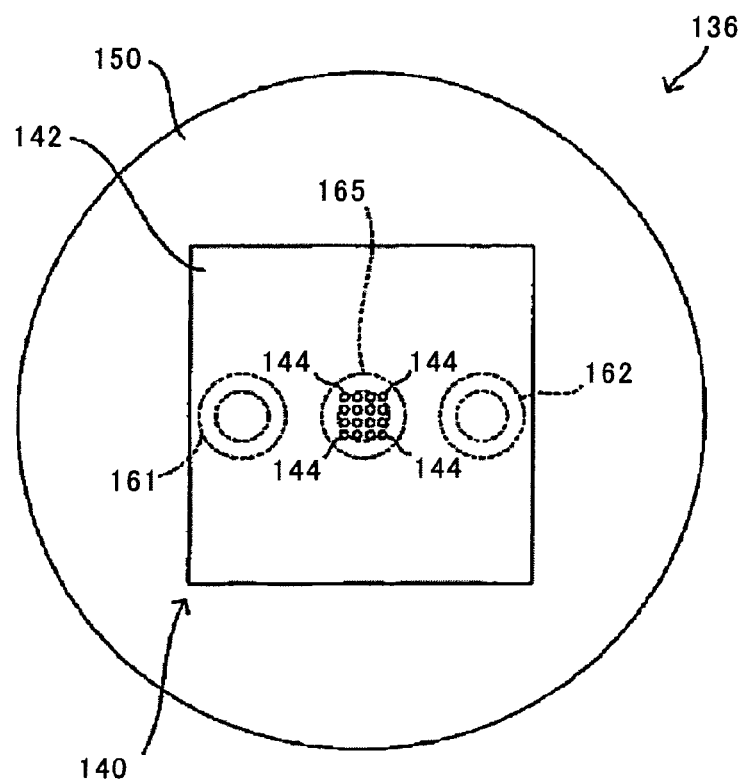
FIG. 11 is a schematic diagram showing a probe card 136 according to a second modified example of the first embodiment of the present invention.
Figure 12:
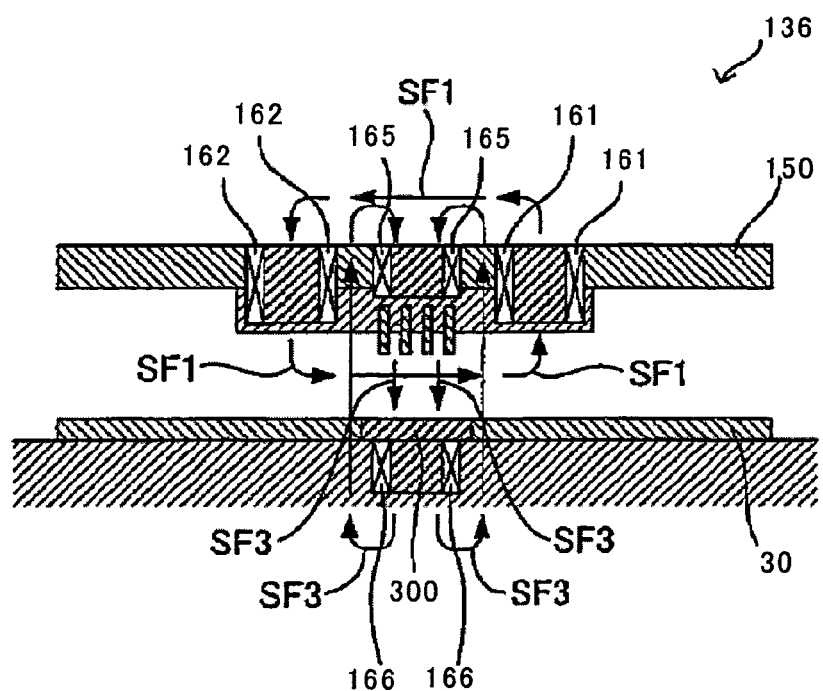
FIG. 12 is a schematic diagram showing a magnetic field SF3 generated by a coil 165 of the probe card 136.

The coil 165 is fixed to the base 142 of the probe card 136. The magnetic field SF3 directing to a Z-direction (refer to an arrow Z in FIG. 10) is generated near the tips of the probes 144 by supplying current to the coil 165. Moreover, as shown in FIG. 11 and FIG. 12, a testing board on which the wafer 30 is placed may have a coil 26. In that case, the coil 165 and the coil 26 are electrically and serially connected to generate magnetic fields directing the same direction inside the coils.

By controlling the magnetic field SF1 generated by the coil 161 and the coil 162 and the magnetic field SF3 generated by the coil 165, a combined magnetic field CF2 which directs to an arbitral direction and is parallel to a virtual plane standing vertically to the surface of the base 142 can be generated.

Figure 13A:
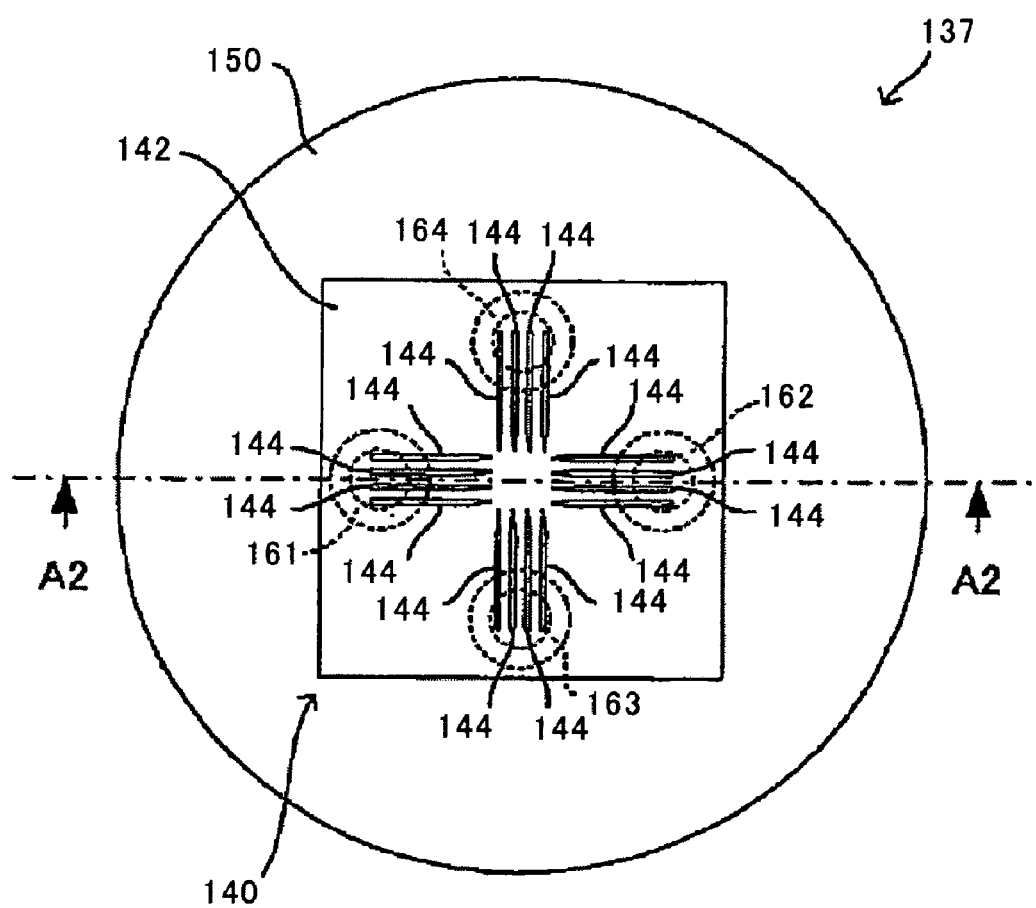
FIG. 13A is a schematic diagram showing a probe card 136 according to other modified example of the first embodiment of the present invention.
Figure 13B:
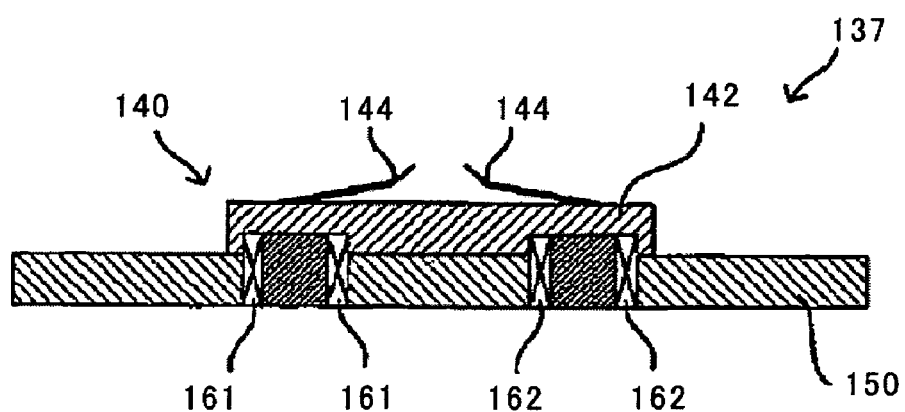
FIG. 13B is a schematic diagram showing a magnetic field SF3 generated by a coil 165 of the probe card 136.

Although in the above-described first embodiment and its modified examples the probes 144 are projecting vertically from the base 142, the shapes of the probes 144 are not limited to that. For example, as a probe card 137 shown in FIG. 13A and FIG. 13B, the probes 144 may be projecting with an inclination to the base 142.

Figure 14:
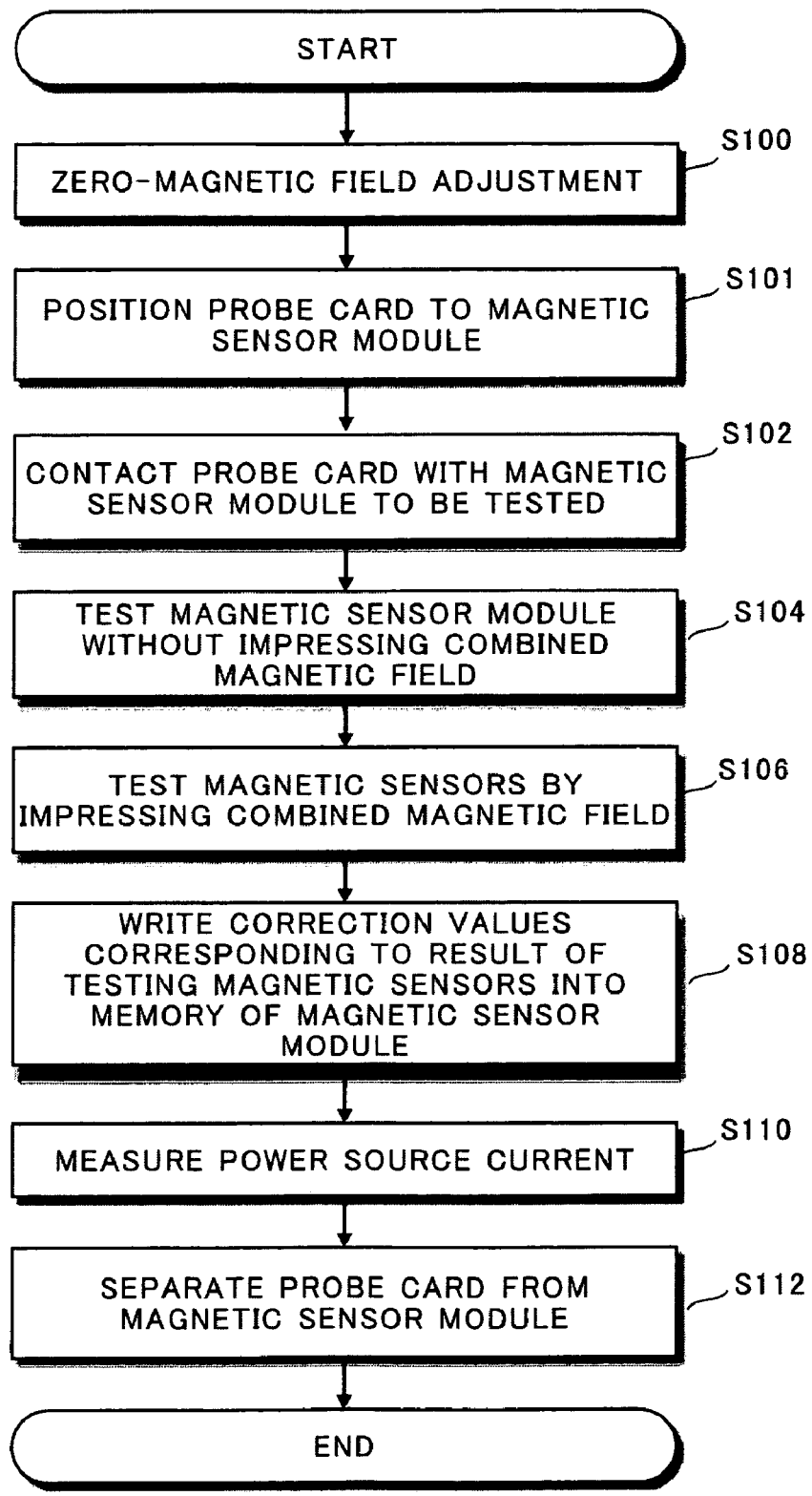
FIG. 14 is a flowchart for explaining a test for a wafer of the magnetic sensor modules 300 by the testing system 1 according to a second embodiment of the present invention.

FIG. 14 is a flowchart for explaining a test for a wafer of the magnetic sensor modules 300 by the testing system 1 according to a second embodiment of the present invention. This flowchart shows processes for testing one arbitral magnetic sensor module 300 out of the plurality of the magnetic sensor modules 300 formed on the wafer 30. In this second embodiment, the same testing system as in the first embodiment is used. The components of the second embodiment similar to the first embodiment are marked with the same reference number as in the first embodiment, and the explanation of those components will be omitted.

At Step S100, the tester main body 200 executes a zero-magnetic field adjustment. For example, the tester main body 200 obtains supplying current value (hereinafter called the zero-magnetic field correction value) that is supplied to the coils necessary for canceling a noise magnetic field imposed to the magnetic sensor module 300 by the magnetic field SF1 and the magnetic field SF2. The noise magnetic field is a magnetic filed that terrestrial magnetism and an electronics device generate.

For example, the zero-magnetic field adjustment is executed by the following way. First, the wafer 30 having the magnetic sensor module 300 of which output when an outer magnetic field is removed (hereinafter called the zero-magnetic field condition) has been known is attached to the prober main body 110. The tester main body 200 reads the supplying current value when the response signal of the magnetic sensor module 300 represents the zero-magnetic field condition as the zero-magnetic field correction value while changing the supplying current value supplied to the coils 161 to 164. Then the tester main body 200 stores the zero-magnetic field correction value into a storage device of the testing system 1, e.g., a memory equipped with the tester main body 200 (not shown in the drawings). The measurement of the response signal of the magnetic sensor module 300 by the tester main body 200 is executed by that the tester main body 200 reads the output signal of the magnetic sensor module 300 via the probe card 130 contacting the magnetic sensor module 300. The method of measuring the response signal will be described in detail later. Further, the zero-magnetic field adjustment does not always have to be executed but will be executed every predetermined times of the testing. In addition to that, the zero-magnetic field adjustment may be executed by configuring a magnetic field measurement device such as gauss meter, etc. near the probes 144 and measuring the outer magnetic field by the magnetic field measurement device.

At Step S101, the tester main body 200 adjusts a position of the magnetic sensor module 300 toward the probe card 130. For example, the tester main body 200 moves the position of the magnetic sensor module 300 to make the X-direction of the probe card 130 and the designed sensing direction of the magnetic sensor 302 parallel to each other and the Y-direction of the probe card 130 and the designed sensing direction of the magnetic sensor 304 parallel to each other. At that time, the probe card 130 is positioned toward the magnetic sensor module 300 preferably in accordance with regular pattern 32 (FIG. 3) formed on the wafer 30. The regular pattern is a pattern appeared regularly on the wafer 30. For example, it may be a pattern of pads included in a development pattern on the wafer, scrub lines, or terminals to be exposed after being covered by resin. For improving the precision, it is preferable to use the regular pattern extending to one direction but to the X-direction and the Y-direction with a predetermined length. By positioning the magnetic sensor module 300 toward the probe card 130 in accordance with regular pattern 32, accurate positioning of the probe card 130 having the coils toward the magnetic sensor module 300 will be possible comparing to, for example, the positioning toward the magnetic sensor module 300 in a chip state in accordance with an alignment mark formed on the magnetic sensor module 300 after dicing, or the positioning the coils for impressing the magnetic fields toward the packaged magnetic sensor module 300 by attaching the packaged magnetic sensor module 300 to a socket. As a result, the magnetic sensor can be tested by impressing the combined magnetic field CF1 in the accurate direction by the coils of the probes card 130; therefore, the precision of testing the magnet sensor can be increased.

At Step S102, the probe card 130 is contacted with the magnetic sensor module 130. For example, the tester main body 200 ascends the test station 120 so that the probes 144 of the probe card 130 are contacted with the terminals of the magnetic sensor module 300. As a result, the tester main body 200 is electrically continued to the magnetic sensor module 300.

At Step S104, the magnetic sensor module 300 is tested without impressing the combined magnetic filed CF1.

Figure 15:
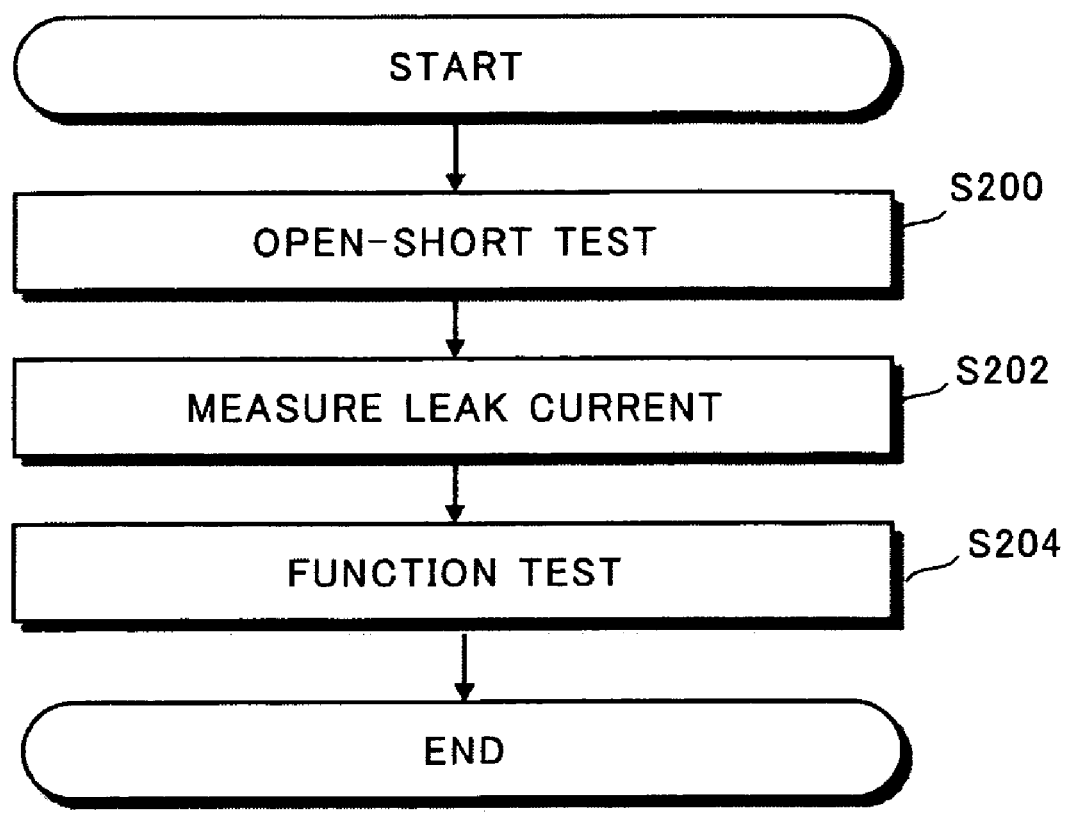
FIG. 15 is a flowchart showing processes executed at Step S104 in FIG. 14.

FIG. 15 is a flowchart showing processes executed at Step S104 in FIG. 14.

At Step 200, the tester main body executes an open-short test. In the open-short test, the tester main body 200 test whether the magnetic sensor module 300 has an open or short-circuit wiring or not by the well-know testing method. The well-known testing method is, for example, the testing method wherein electrical continuity between predetermined terminals (including a terminal for a test other than input or output terminal) by impressing current to the terminals or the testing method such as boundary scanning, etc.

At Step S202, the tester main body 200 executes a leak-current test. In the leak-current test, the tester main body 200 measures leak-current by impressing voltage to the predetermined terminals (including a terminal for a test other than input or output terminal) of the magnetic sensor module 300 via the probe card 130 and judges whether the magnetic sensor module 300 is normal or abnormal.

At Step S204, the tester main body executes a function test. In the function test, the tester main body 200 tests the magnetic sensor module 300 to judges whether the digital signal processor 340 is working as designed or not.

For example, the function test is executed by the following way. The testing system 1 stores plurality patterns. of testing signals and the response signals that are output when the testing signals are input to the normally working digital signal processor. The tester main body 200 impresses power source voltage to the terminal 364 of the magnetic sensor module 300 via the probe card 130, inputs the clock signal to the terminal 360 and inputs one of the testing signals to the terminal 362. As a result, the digital signal processor 340 outputs the response signal corresponding to the testing signal. The tester main body 200 reads the response signal via the probe card 130. Then the tester main boy 200 compares the response signal output from the digital signal processor 340 with the normal response signal to judge whether the digital signal processor 340 is working as designed or not. The tester main body 200 tests a plurality of functions of the digital signal processor 340 by repeating the above-described series of the processes by using the plurality of the testing signals and the corresponding normal response signals stored in the storage device. Further, in the testing step at Step S104, the tester main body 200 just needs to execute the test of the magnetic sensor module 300 without impressing the combined magnetic field CF to the magnetic sensor module 300, and the open-short test, the leak current test and the function test do not have to be executed.

After finishing the test at Step S104, the process returns to FIG. 14, at Step S106, the tester main body 200 tests the magnetic sensors of the magnetic sensor module 300. In the magnetic sensors test, continued from the function test, the combined magnetic field CF1 is impressed to the magnetic sensor module 300 while the power source voltage and the clock signal are supplied to the magnetic sensor module 300.

Figure 16:
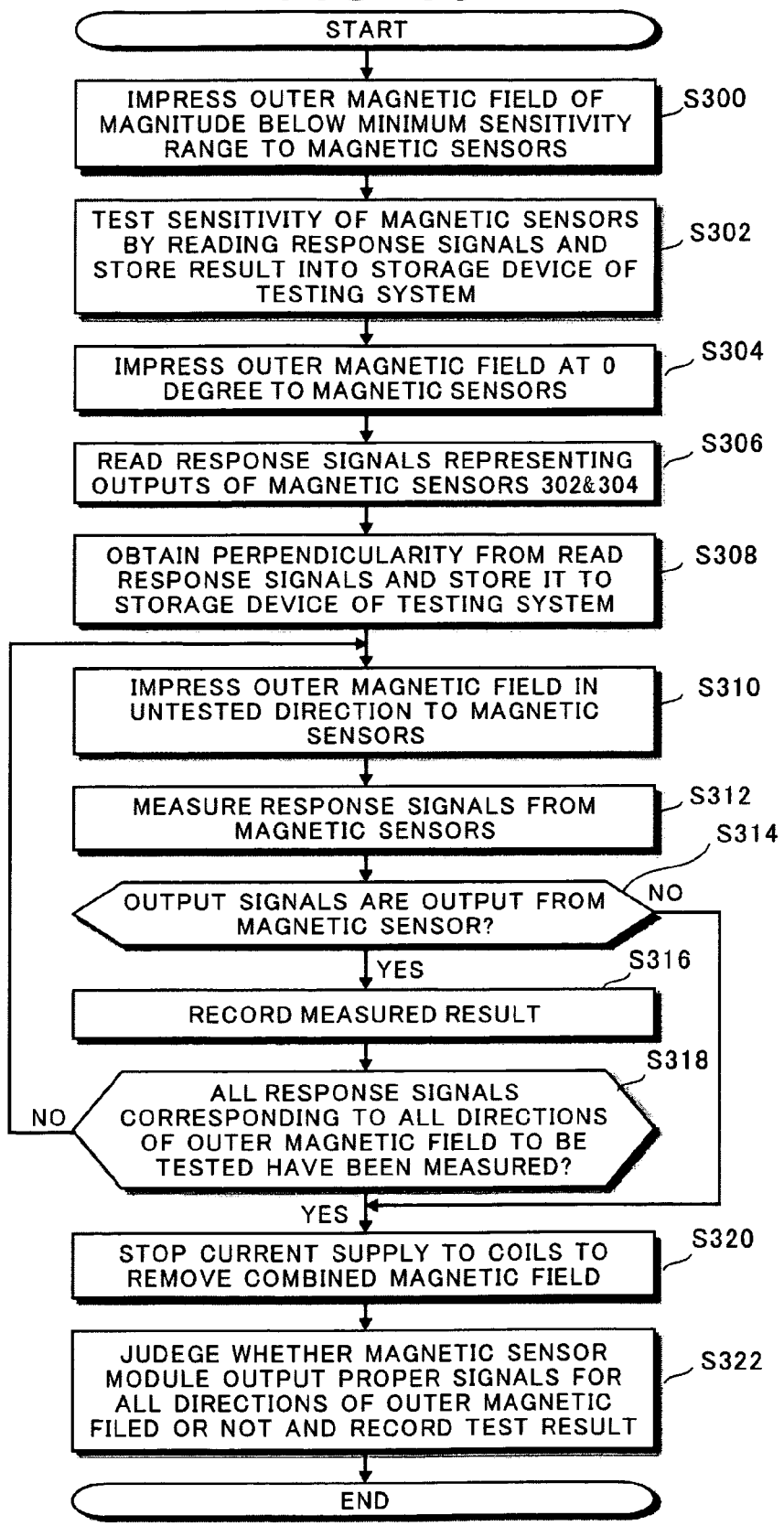
FIG. 16 is a flowchart showing processes for the magnetic sensors test.

FIG. 16 is a flowchart showing processes for the magnetic sensors test.

From Step S300 to Step S302, the tester main body 200 executes sensitivity test. For example, at Step S300, the tester main body 200 impresses an outer magnetic field at minimum strength of a sensitivity range to the magnetic sensors. Further in detail, the tester main body 200 generates the combined magnetic field CF1 to impress the outer magnetic field at minimum strength of a sensitivity range to the magnetic sensors by supplying current considering the zero-magnetic field correction value to the coils 161 to 164. Next, the tester main body 200 reads a response signal from the magnetic sensor module 300 via the probe card 130, and tests the sensitivity of the magnetic sensors by judging whether the read response signal corresponds to the impressing outer magnetic field or not. Thereafter, at Step S302, the tester main body 200 stores the test result of the sensitivity test in the storage device of the testing system 1.

From Step S304 to Step S308, the tester main body 200 executes a perpendicularity test. For example, at Step S304, the tester main body 200 impress the outer magnetic field to the magnetic sensors at 0 degree. Further in detail, the tester main body 200 generates the combined magnetic field CF1 to impress the outer magnetic field at 0 degree to the magnetic sensors by supplying current considering the zero-magnetic field correction value to the coils 161 to 164. Next at Step S306, the tester main body 200 makes the digital signal processor 340 output the response signal representing the output of the magnetic sensor 302 and the response signal representing the output of the magnetic sensor 304 and reads those response signals via the probe card 130. Then at Step S308, the tester main body 200 determines perpendicularity of the outputs of the magnetic sensors 302 and 304 from the read response signals and stores the perpendicularity of the outputs of the magnetic sensors 302 and 304 in the storage device of the testing system 1. Moreover, the direction of the impressing outer magnetic field may be any angle other than 0 degree. Furthermore, the perpendicularity of the outputs of the magnetic sensors 302 and 304 may be judged by the response signals corresponding to the outer magnetic fields in a plurality of directions (impressed at a plurality of angles).

From Step S310 to Step S318, the tester main body 200 impresses the outer magnetic fields to the magnetic sensor module 300 at a predetermined interval for 360 degrees, and angle signals as the response signals corresponding to the outer magnetic fields for every time when the outer magnetic field to the different direction is impressed to the magnetic sensor module 300. Hereinafter, the processes from S310 to Step S318 are called the detected angle test. As a result of obtaining the angle signals, a direction circle of the outputs can be obtained, for example, inside the coordinates side to the X-direction and the Y-direction. The test judges that the direction circle is closed or oval and the center of the circle is shifted or not.

At Step S310, the tester main body 200 impresses an outer magnetic field directing to an unmeasured direction to the magnetic sensor module 300. For example, in a case of testing an output signal corresponding to 360 degrees outer magnetic fields at 22.5 degrees interval, the tester main body 200 generates the combined magnetic fields CF1 to be directed to 0 degree, 22.5 degrees, 45.0 degrees . . . 337.5 degrees in order.

At Step S312, the tester main body 200 reads the response signals of the magnetic sensor module 300 via the probe card 130.

At Step S314, the tester main body 200 judges whether the response signals are output from the magnetic sensor module 300 or not. When the magnetic sensor module 300 outputs the signals, the process advances to Step S316. When the magnetic sensor module 300 does not output the signal, the magnetic sensor module 300 is regarded as defection, the measuring of the magnetic sensor module 300 is terminated even if an unmeasured direction of the outer magnetic field exists. Further, the measurement may be continued if the magnetic sensor module 300 does not output the signals.

At Step S316, the tester main body 200 stores result of the measurement (read response signals) at Step S312 in the storage device of the testing system 1.

At Step S318, the tester main body 200 judges whether the measurements by all the directions of the outer magnetic fields have been completed or not. If an unmeasured direction of the outer magnetic field exists, the process returns to Step S310. If the measurements by all the directions of the outer magnetic fields have been completed, the process advances to Step S320, and the tester main body 200 removes the combined magnetic field CF by stopping supplying the current to the coils 161 to 164. Further, timing of the removing the combined magnetic field CF1 may be anytime after measurement of all the directions of the outer magnetic fields have been completed.

At Step S322, the tester main body 200 judges whether the magnetic sensors output proper signals corresponding to all the directions of the outer magnetic fields or not and stores the result of the judgment as a test result of the detected angle test into the storage device of the testing system 1. For example, taking into account the result of the perpendicularity test, the tester main body 200 evaluates the output signals of the magnetic sensors corresponding to all the directions of the outer magnetic fields in accordance with difference between the measured response signals and the ideal response signals corresponding to the impressed outer magnetic fields.

After the above-described detected angle test has been completed, the process advances to the testing process at Step S108 in FIG. 14.

At Step S108, the tester main body 200 writes correction values corresponding to the testing results of the various tests into the memory 330 of the magnetic sensor module 300.

At Step S110, the tester main body 200 tests the power source current. For example, the tester main body 200 measures consumed current of the magnetic sensor module 300 at the time of a predetermined operation. For example, the time of the predetermined operation is a time when the magnetic sensor module 300 is not working or a time when the angle signals are read. The tester main body 200 judges normality and abnormality (defection) of the power source current by comparing the measured consumed current and the consumed current of the normal magnetic sensor module 300.

At Step S112, the tester main body 200 separates the probe card 130 from the magnetic sensor module 300. For example, the tester main body 200 descends the magnetic sensor module 300 to separate the probes 144 of the probe card 130 from the terminals 360 to 364 of the magnetic sensor module 300.

As described above, the test of the wafer of the magnetic sensor module 300 by the testing system 1 according to the second embodiment can test the digital signal processor 340 and the magnetic sensors and write the correction values of the magnetic sensors into the memory 330 at one connection of the probe card 130 to the magnetic sensor module 300. The testing processes for the magnetic sensor module 300 can be simplified as that; therefore, a manufacturing cost of the magnetic sensor module 300 can be decreased.

Further, when the testing result of each test in the wafer test according to the second embodiment shows defection of the magnetic sensor module 300, the succeeding test does not have to be executed and the unmeasured (untested) magnetic sensor module 300 may be tested instead. In addition to that, the tester main body 200 may not judge the testing result for every test.

Figure 17:
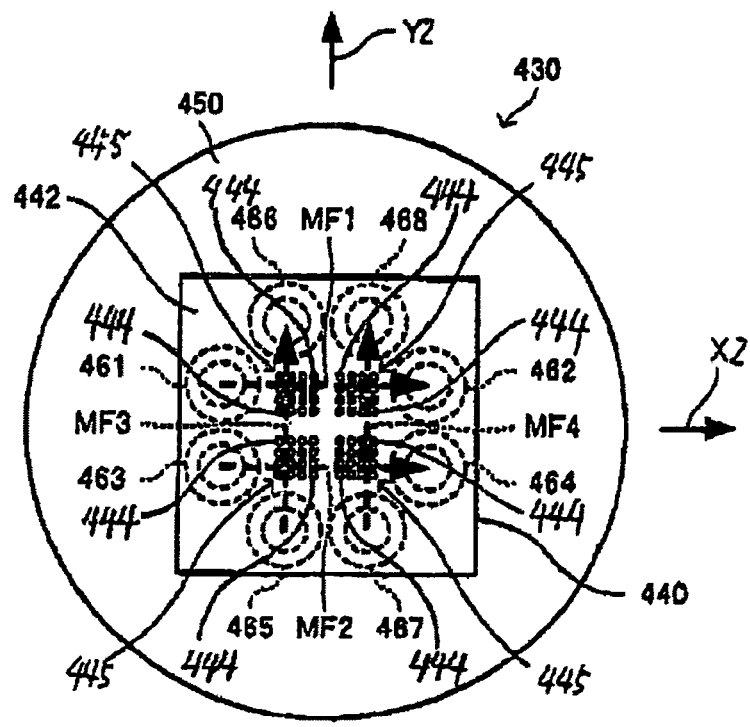
FIG. 17 is a plan view showing a probe card 430 according to a first modified example of the second embodiment of the present invention.
Figure 18:
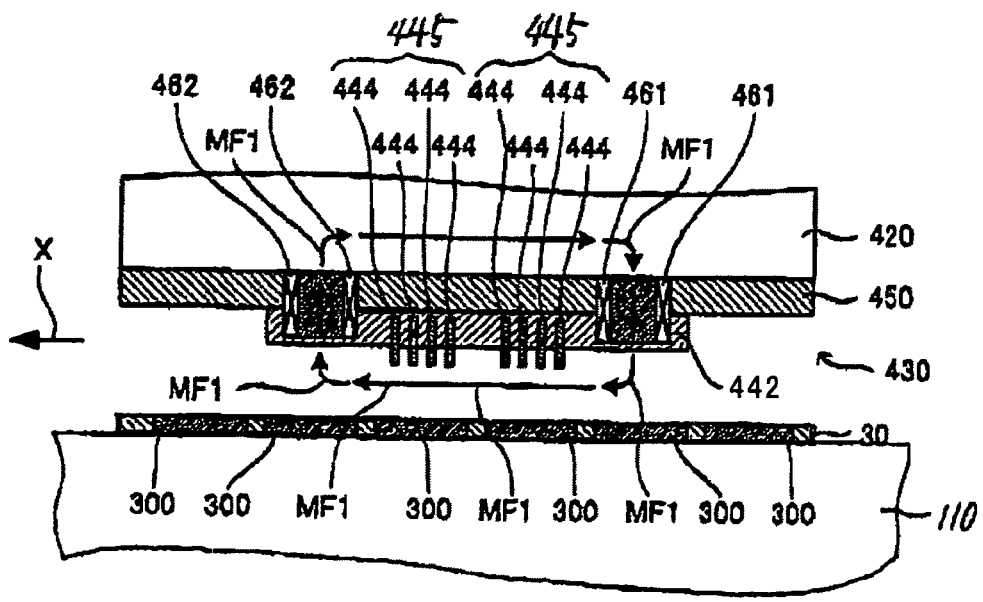
FIG. 18 is an enlarged view showing the probed card 430 at the time of tests.

FIG. 17 is a plan view showing a probe card 430 according to a first modified example of the second embodiment of the present invention. FIG. 18 is an enlarged view showing the probed card 430 at the time of tests. In this first modification of the second embodiment, all the components other than the probe card 430 are substantially same as those in the first and second embodiments.

The probe card 430 is consisted of a probe head 440, a printed wiring board 450, coils 461 to 468, etc. The printed wiring board 450 is the substantially same as the printed wiring board 150 in the first and second embodiments.

The probe head 440 has a base 442 and a plurality of probe groups 445. The plurality of the probe groups 445 are positioned near the center of the base 442 in the shape of a lattice, and each probe group 445 is consisted of the probes 444 that are the substantially same as the probes 144 in the first and second embodiments. The probe card 430 can contact with the plurality of the magnetic sensor modules 300 formed on the wafer 30. Further, the number of the probe groups 445 is not limited to four as shown in the drawing but also may be two, three or more than four. In addition to that, the positions of the probe groups 445 are defined in accordance with the arrangement of the magnetic sensor modules 300 formed on the wager 30; therefore, the probe groups 445 can be arranged on the base 442 in any way.

The coils 461 to 468 are fixed to the probes head 440 similar to the coils 151 to 164 in the first and second embodiments. The coils 461 and the coil 462 are arranged on facing sides of the probe groups 445 and connected as same as the coils 161 and 162. The coils 461 and the coil 462 generate a magnetic field MF1 near tips of the probe groups 445 by current supply. The coils 463 and the coil 464 are arranged on facing sides of the probe groups 445 to generate a magnetic field MF2 near tips of the probe groups 445 in the same direction as the magnetic field MF1.

The coils 465 and the coil 466 are arranged on facing sides of the probe groups 445 to generate a magnetic field MF3 near tips of the probe groups 445 in a direction crossing with the magnetic fields MF1 and MF2 at a right angle. The coils 467 and the coil 468 are arranged on facing sides of the probe groups 445 to generate a magnetic field MF4 near tips of the probe groups 445 in the same direction as the magnetic field MF3. Hereinafter, a direction from the coil 461 to the coil 462 is called X2-direction (refer to an arrow X2), and a direction from the coil 465 to the coil 466 is called Y2-direction (refer to an arrow Y2).

By arranging two coils on each side of the probe groups 445, the uniformed magnetic fields to the X2-direction near the tips of the probe groups 445 by the magnetic field MF1 and the magnetic field MF2 can be impressed, and the uniformed magnetic fields to the Y2-direction near the tips of the probe groups 445 by the magnetic field MF3 and the magnetic field MF4 can be impressed. Further, more than two coils may be arranged on each side of the probe groups 445.

Each step of the testing of the magnetic sensor module 300 formed on the wafer by the testing system 1 according to the first modified example of the second embodiment is substantially same as each step of the testing of the magnetic sensor module 300 formed on the wafer by the testing system 1 according to the second embodiment except the plurality of the magnetic sensor modules 300 are tested at once at each step.

In the testing of the magnetic sensor module 300 formed on the wafer by the testing system 1 according to the first modified example of the second embodiment, the digital signal processors and the magnetic sensors are tested by a single occasion of connecting the probe card 430 to the magnetic sensor modules 300; therefore, the number of times of connecting the probe card 430 to the magnetic sensor modules 300 can be decreased. As a result, a testing time for each magnetic sensor module 300 can be shortened, and therefore, the manufacturing cost of the magnetic sensor module 300 can be further decreased.

Figure 19:
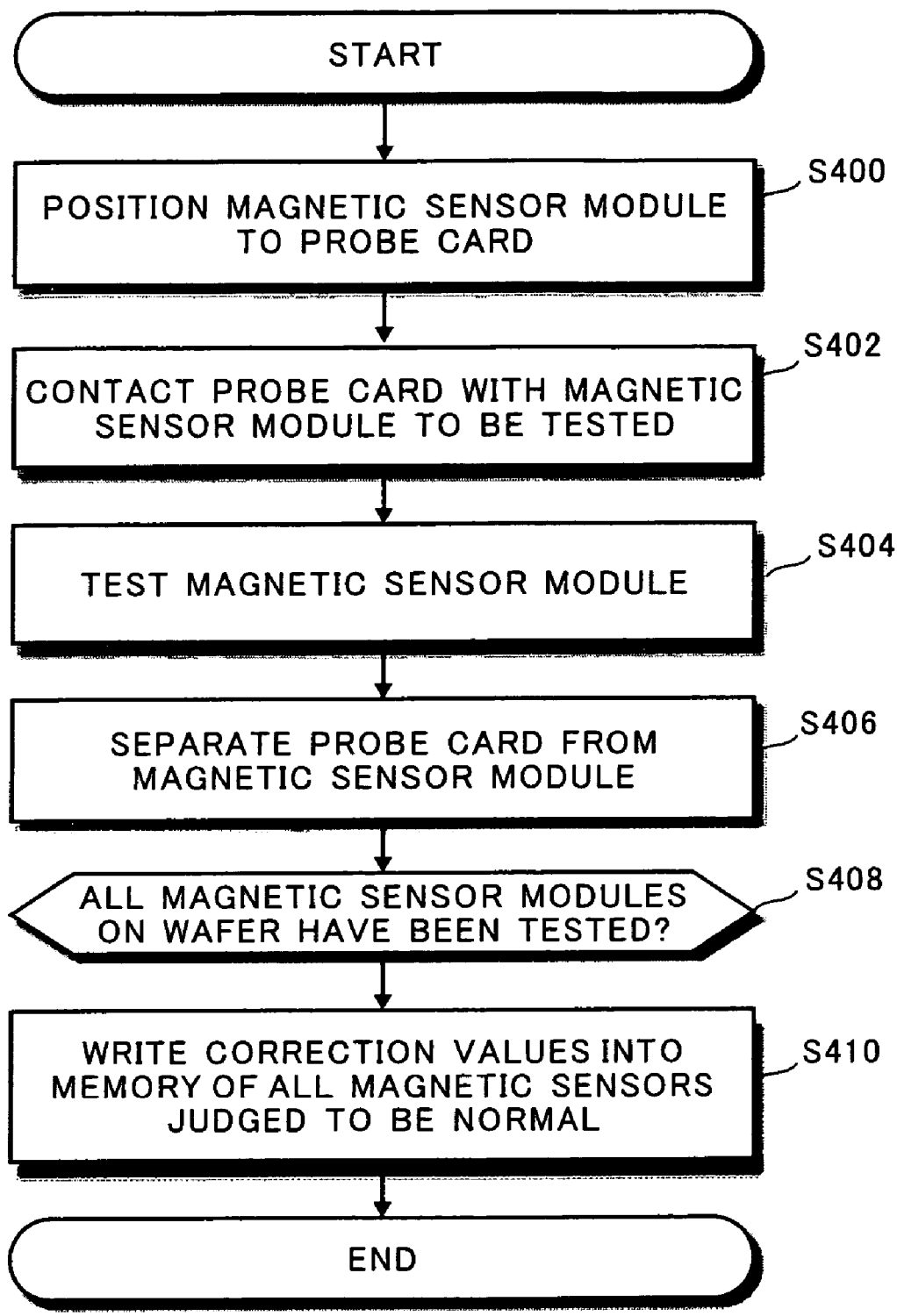
FIG. 19 is a flowchart showing a test of the magnetic sensor module according to the second modified example of the second embodiment of the present invention.

FIG. 19 is a flowchart showing a test of the magnetic sensor module according to the second modified example of the second embodiment of the present invention. In the flowchart shown in FIG. 19, the step for the zero-magnetic adjustment is omitted.

In the wafer test according to the second embodiment, the test of the wafer of the magnetic sensor module 300 by the testing system 1 according to the second embodiment can test the digital signal processor 340 and the magnetic sensors and write the correction values of the magnetic sensors into the memory 330 at one connection of the probe card 130 to the magnetic sensor module 300. However, when a magnetic sensor module does not have a storage device to which the correction values of the magnetic sensors can be electrically written (e.g., the memory 330 according to the second embodiment), the second embodiment cannot be applied without a modification. Therefore, in this second modified example, a testing method for the magnetic sensor module without electrically writable storage device that can decrease the manufacturing cost will be described.

The magnetic sensor module according to the second modified example of the second embodiment of the present invention has a laser-writing memory instead of the memory 330 of the magnetic sensor module 300. Therefore, the testing system in this example has a laser-radiating device in addition to the same components as in the testing system 1 in the above-described embodiments.

At Step S400, as similar to Step S101 in the second embodiment, the tester main body 200 positions the unmeasured magnetic sensor module 300 formed on the wafer 30 to the probe card 130.

At Step S402, the tester main body 200 makes the probe card 130 contact with the unmeasured magnetic sensor module 300 formed on the wafer 30.

At Step S404, as similar to Step S104 to Step 110 in the second embodiment, the tester main body 200 executes the various tests of the magnetic sensor module 300. However, the tester main body 200 does not execute the process corresponding to Step S108, that is, a process for writing the correction values of the magnetic sensors into the laser writing memory, but stores the correction values into the storage device of the testing system. The tester main body 200 writes the correction values of all the magnetic sensor modules 300 that have been judged as normal products into the laser-writing memory after all of the magnetic sensor modules 300 have been tested. The details will be described at Step S410.

At Step S406, the tester main body 200 separates the probes card 130 from the magnetic sensor module.

At Step S408, the tester main body 200 judges whether all the magnetic sensor modules have been tested or not. When the untested magnetic sensor module exists, the process retunes to Step S400, and the tester main body 200 tests the untested magnetic sensor module. When all the magnetic sensor modules have been tested, the process advances to Step S410.

At Step S410, the tester main body 200 writes the correction values stored in the storage device of the testing system into the corresponding memories of the magnetic sensor modules that have been judged as normal products by the laser-radiating device. For example, the tester main body 200 makes the laser-radiating device radiate laser light to the laser-writing memory to cut a part of a memory circuit of the laser-writing memory by the laser light for writing the correction values of the magnetic sensors into the laser-writing memory.

In the wafer test according to the second modified example of the second embodiment, the correction values of the magnetic sensors are written into the memory after all the magnetic sensor modules formed on the wafer 30 have been tested; therefore, the processes for testing the magnetic sensor module can be simplified comparing to the case that the testing of the magnetic sensor module 300 by the probe card 130 and wiring the correction values of the magnetic sensors into the memory by the laser-radiating device are executed alternatively. Therefore, the manufacturing cost of the magnetic sensor module can be decreased.

Further, the wafer test according to the second modified example of the second embodiment can be applied to the magnetic sensor module having the memory that is electrically writable.

Figure 20:
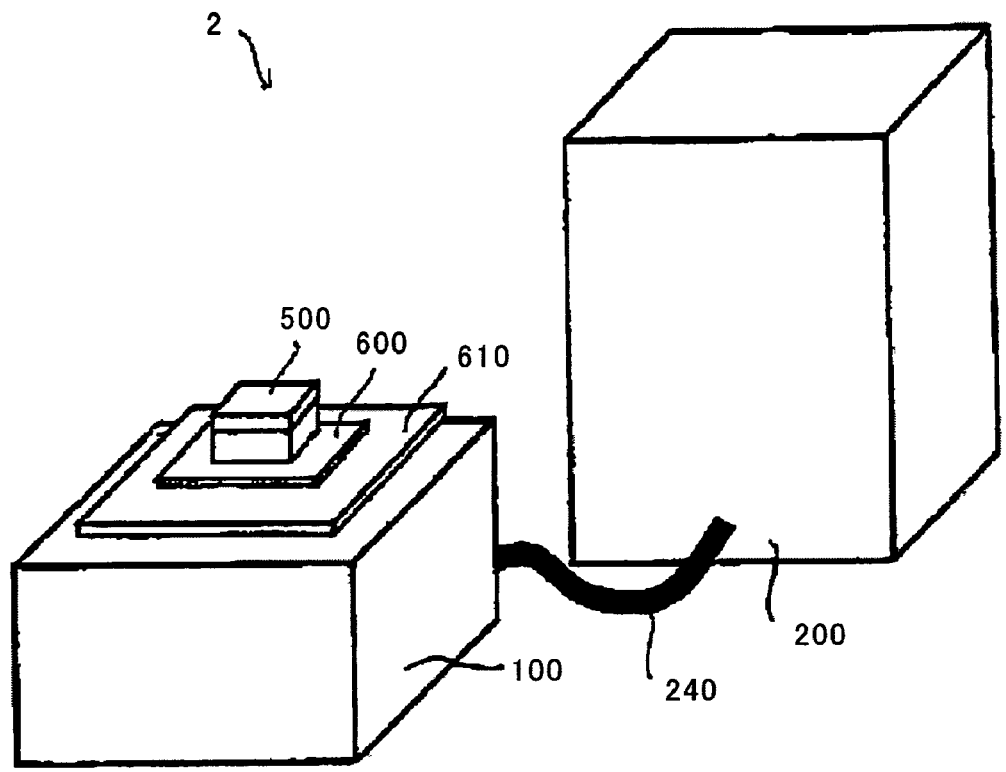
FIG. 20 is a schematic diagram showing a testing system 2 according to a third embodiment of the present invention.

FIG. 20 is a schematic diagram showing a testing system 2 according to a third embodiment of the present invention. The components of the third embodiment similar to the first and the second embodiments are marked with the same reference numbers as in the first and the second embodiments, and the explanation of those components will be omitted.

The testing system 2 according to a third embodiment is consisted of a testing socket (probe card) 500, a sub-substrate 601, a main-substrate 610, the test station 100, the tester main body 200, etc., and executes the tests of the magnetic sensor module 300 after being packaged, i.e., so called delivery inspection.

Figure 21:
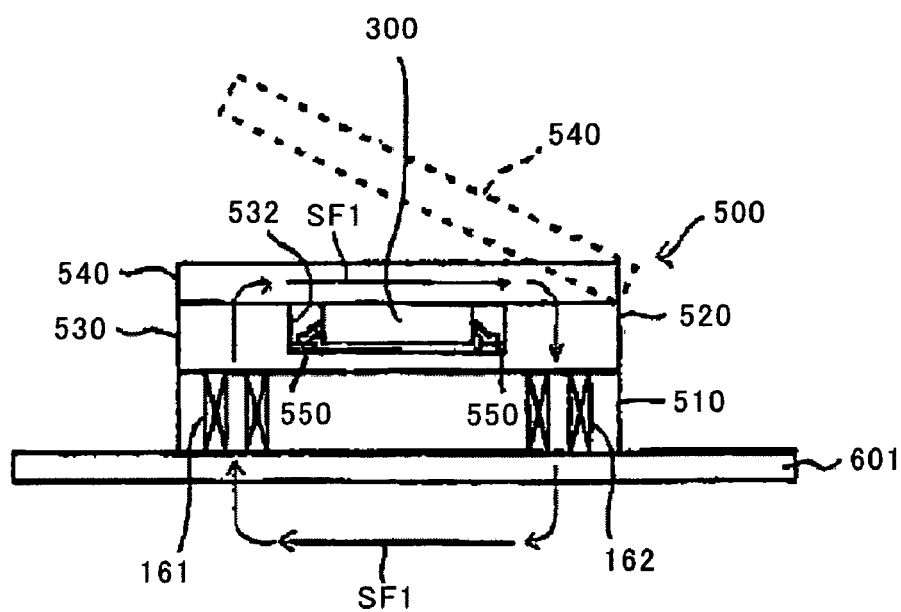
FIG. 21 is an enlarged diagram showing the testing socket 500 according to the third embodiment at a time of the tests.

The testing socket 500 encloses the magnetic sensor module 300 to be tested (refer to FIG. 21). The testing socket 500 is fixed to the sub-substrate 601 and is electrically connected with the sub-substrate 601. For example, input/output pins of the testing socket 500 are soldered to the terminals of the sub-substrate 601. The sub-substrate 601 is fixed to the main-substrate 610 and is electrically connected with the main-substrate 610. For example, the sub-substrate 601 is connected to the main-substrate 610. The main-substrate 610 is fixed to the test station 100 and is electrically connected with an inner circuit of the test station 100. The test station 100 is connected to the tester main body 200 with a cable 240.

FIG. 21 is an enlarged diagram showing the testing socket 500 according to the third embodiment at a time of the tests.

The testing socket 500 is consisted of an adaptor socket 510, a socket main body 520, the coils 161 to 164, etc.

The socket main body 520 is consisted of a base 530, a lid 540, probes 550, etc. The base 530 has concave part 532 for enclosing the magnetic sensor module 300. The probes 550 are arranged inside the concave part 532 of the base 530 in correspondence with the terminal of the magnetic sensor module 300. The probes 550 connect with the terminal of the magnetic sensor module 300 at the time of the tests. As a result, the tester main body 200 will be electrically continued with the magnetic sensor module 300 via the probes 550. It is preferable for metal components of the testing socket 500 such as the probes 550 to be demagnetized. By demagnetizing the metal components, magnetization of the metal components by the magnetic fields generated by the coils 161 to 164 can be prevented. As a result, precision of the testing the magnetic sensors can be improved. Further, shapes of the probe 550 are not limited to those shown in the drawing and may be any type that can be connect with the terminals of the magnetic sensor module 300.

The lid 540 is connected to the base 530 in a condition that the position of the lid 540 can be moved from the position for opining the concave part 532 (refer to the lid in the dotted-line in FIG. 21) to the position for closing the concave part 532 (refer to the lid in the solid-line in FIG. 21). In the position for closing the concave part 532, the lid 540 pushes the magnetic sensor module 300 to a direction for closely contacting the probe 550 with the terminals of the magnetic sensor module 300. As a result, the probe 550 can be contacted firmly with the terminals of the magnetic sensor module 300. Further, the lid may not be connected to the base 530. In that case, the lid 540 will be fixed to the base 530 in the closing position by pins, etc. In addition to that, the socket main body 520 may not have the lid 540 if the probe 550 can be contacted firmly with the terminals of the magnetic sensor module 300.

The coils 161 to 164 are fixed to the adaptor socket 510. Other features of the coils are substantially same as those in the first embodiment. The plan view of the socket 500 is almost the same as the probe card 130 of the first embodiment shown in FIG. 4; therefore, the explanations will be omitted. In addition to that, the shape of cross sections of the coils 161 to 164 may be rectangle as shown in a probe card 51 (FIG. 7) or oval (FIG. 22).

The socket main body 520 is connected to the adaptor socket 510 in a condition that the socket main body 520 is arbitrarily attached to and detached from to the adaptor socket 510. As a result, only the socket main body 520 needs to be replaced when the probes 550 are worn by friction with the terminals of the magnetic sensor module 300. Moreover, if the socket main body 520 has the coils 161 to 164, the adaptor socket may be omitted.

The tester main body 200 shown in FIG. 20 tests the magnetic sensor module 300 by inputting a testing signal to the magnetic sensor module 300 via the probes 550 of the testing socket 500, generating magnetic fields in the coils 161 to 164 of the testing socket 500, and obtaining a response signal of the magnetic sensor module 300 corresponding to the testing signal via the probes 550 of the testing socket 500.

Figure 23:
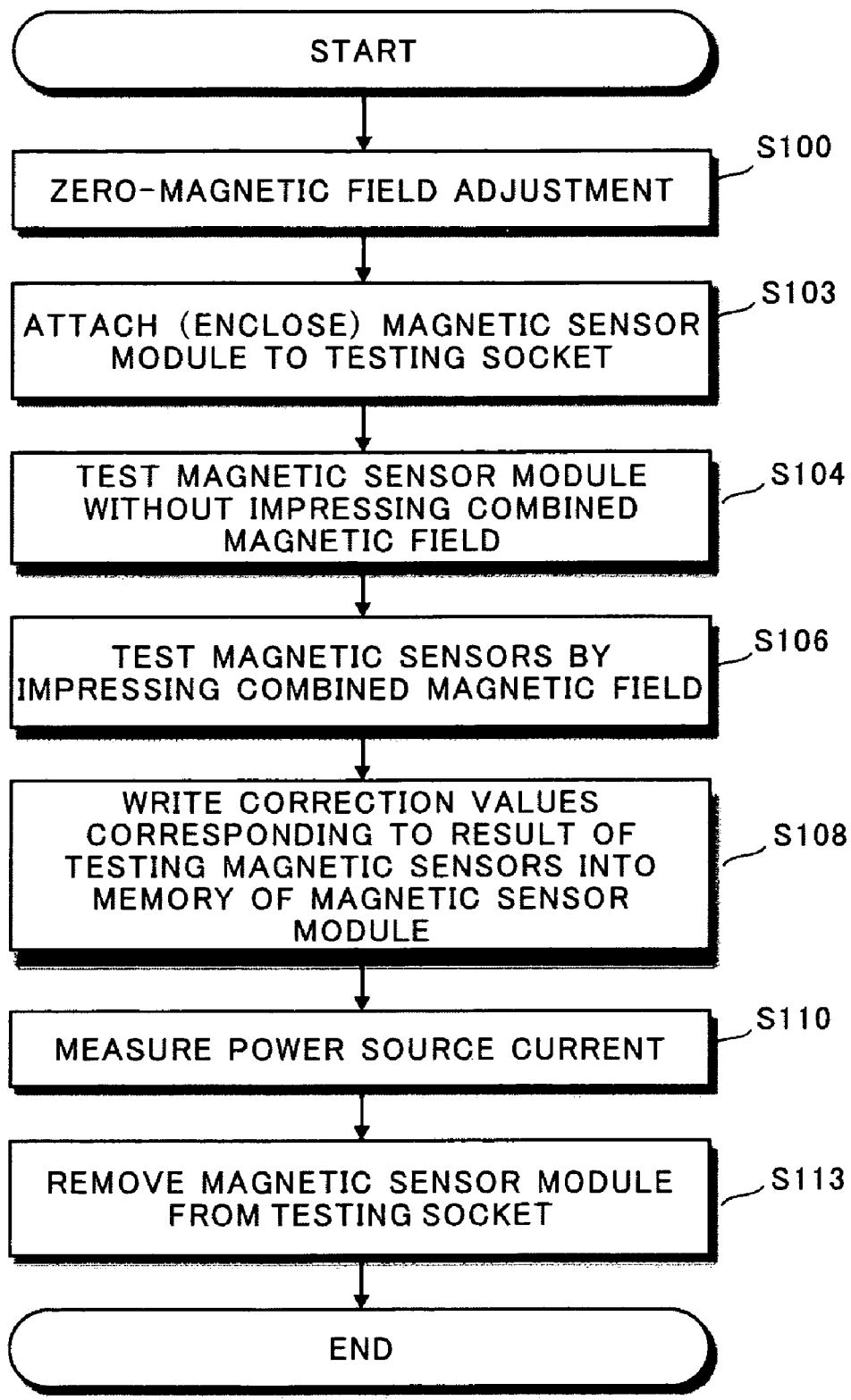
FIG. 23 is a flowchart showing the delivery inspection of the magnetic sensor module 300 by the testing system 2 according to the third embodiment of the present invention.

FIG. 23 is a flowchart showing the delivery inspection of the magnetic sensor module 300 by the testing system 2 according to the third embodiment of the present invention. Steps (S100 S104 to S110) that are substantially same as in the test for a wafer of the magnetic sensor modules 300 by the testing system 1 according to a second embodiment are marked with the same reference numbers as in the first embodiment, and the explanations for those steps will be omitted.

At Step S100, the zero-magnetic field adjustment similar to the first embodiment is executed.

At Step S103, the magnetic sensor module 300 is attached to the testing socket 500. As a result, the terminals of the magnetic sensor 300 are contacted with the probes 550 of the testing socket 500, and the magnetic sensor module 300 is electrically continued with the tester main body 200 via the probes 550.

At Step S104 to Step S110, the various tests, etc. similar to the first embodiment are executed.

At Step S113, the magnetic sensor module 300 is removed from the testing socket 500.

In the delivery inspection of the packaged magnetic sensor module 300 by the testing system 2 according to the third embodiment, the testing of the digital signal processor 340 and the magnetic sensors of the magnetic sensor module 300 and the writing of the correction values of the magnetic sensors to the memory 330 can be executed by one placement of the magnetic sensor module 300 to the testing socket 500. Therefore, the testing processes of the magnetic sensor module 300 can be simplified, and the manufacturing cost of the magnetic sensor module 300 can be decreased.

Further, when the testing result of each test in the delivery inspection according to the third embodiment shows defection of the magnetic sensor module 300, the succeeding test does not have to be executed and the unmeasured (untested) magnetic sensor module 300 may be tested instead. In addition to that, the tester main body 200 may not judge the testing result for every test.

Figure 24:
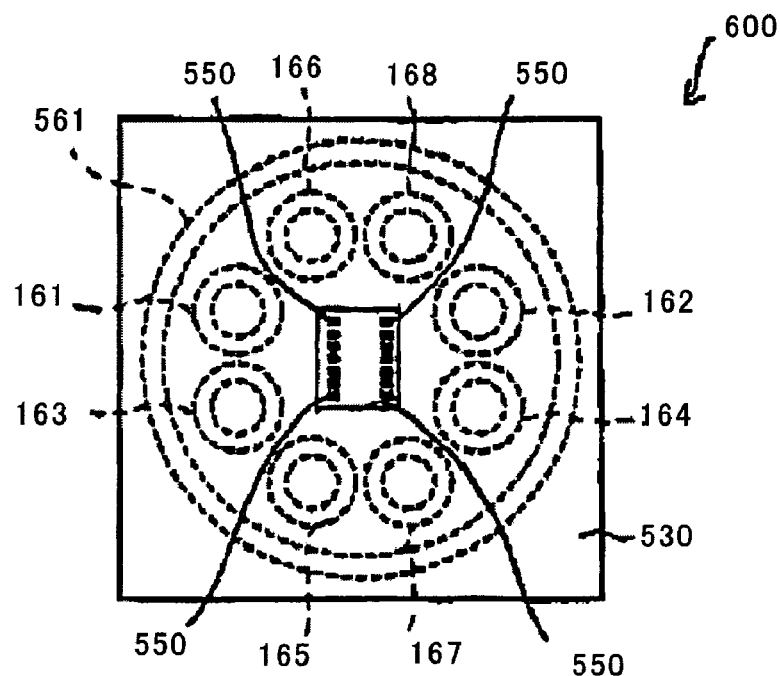
FIG. 24 is a plan view showing the testing socket according to the modified example of the third embodiment of the present invention.
Figure 25:
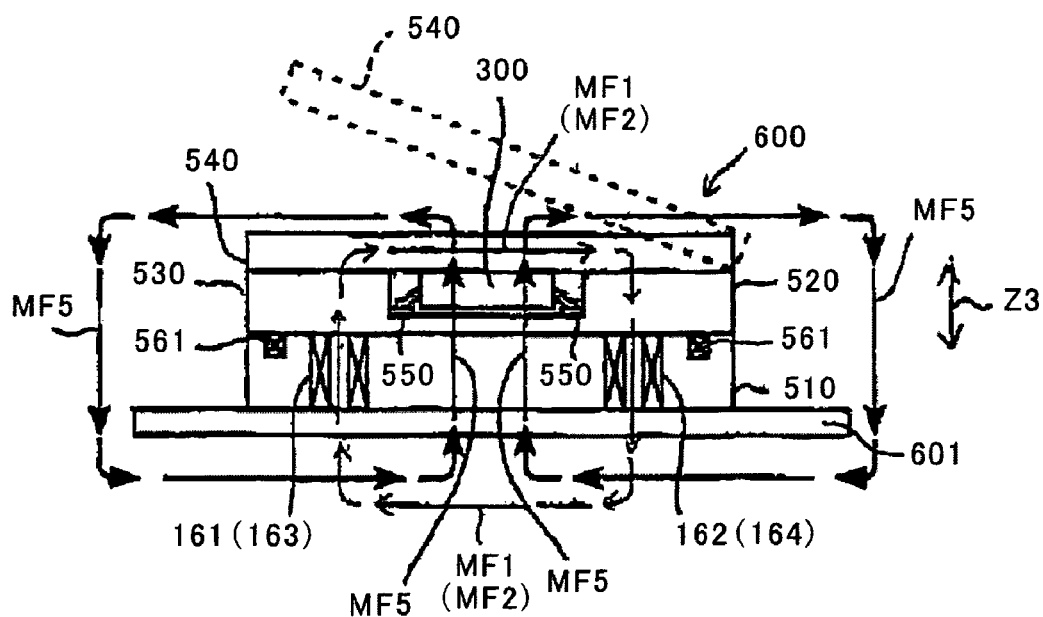
FIG. 25 is an enlarged diagram showing the testing socket according to the modified example of the third embodiment at the time of the testing.

FIG. 24 is a plan view showing the testing socket according to the modified example of the third embodiment of the present invention. FIG. 25 is an enlarged diagram showing the testing socket according to the modified example of the third embodiment at the time of the testing.

In this modification of the third embodiment, all the components other than the testing socket 600 are substantially same as those in the third embodiments.

The testing socket 600 according to the modified example of the third embodiment has coil 561 in addition to all the components of the probe card 135 according to the first modified example of the first embodiment. The coil 561 is fixed to the adaptor socket 510 and can generate a magnetic field MF5 to a Z3-direction (an arrow Z3 in the drawing) near the probes 550 of the testing socket 600 by supplying current to the coil 561.

The testing socket 600 according to the modified example of the third embodiment can generate a combined magnetic field toward an arbitral direction in a three-dimension generated near the probes 550 of the testing socket 600.

Figure 26:
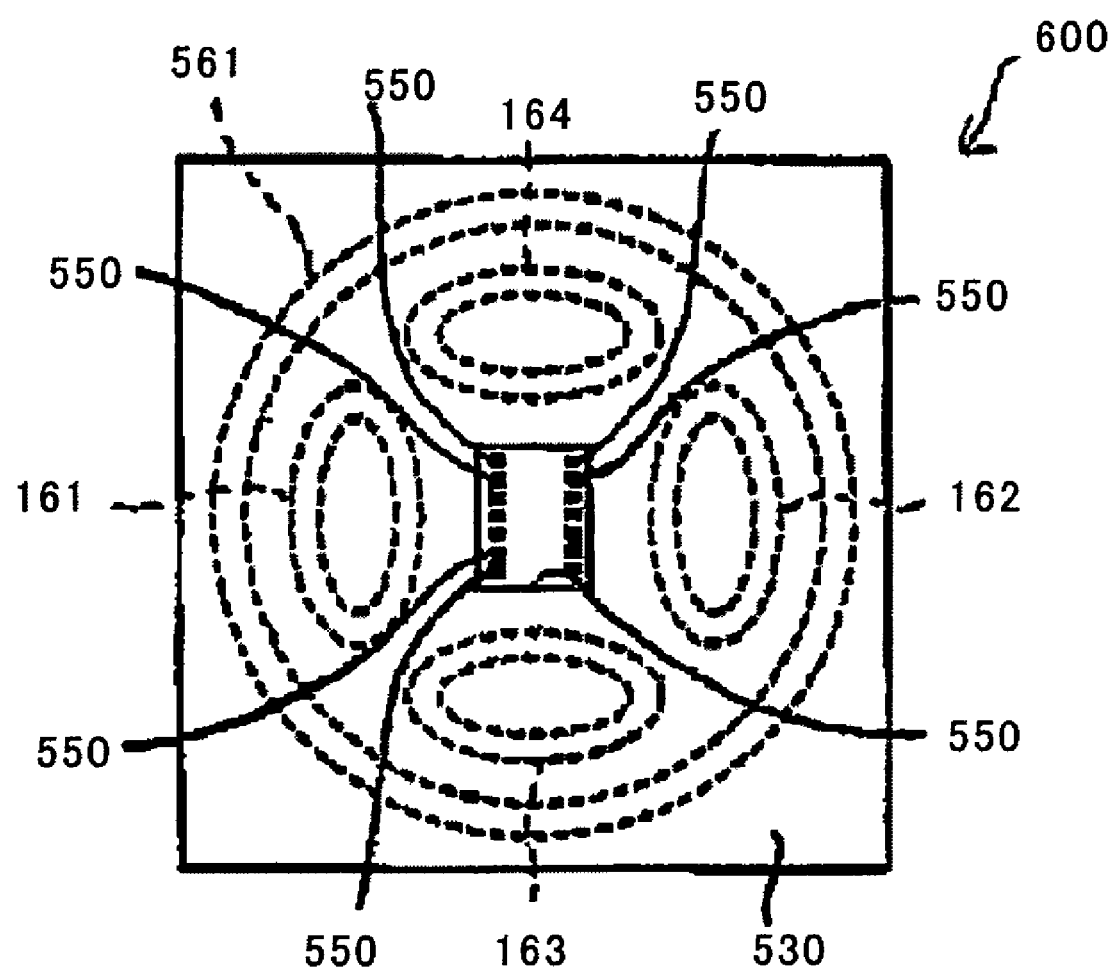
FIG. 26 is a plan view showing the testing socket according to other modified example of the third embodiment of the present invention.

Moreover, the coil 561 may be applied to any types of the testing socket or probe card in this specification. For example, as shown in FIG. 26, the coil 561 can be added to the testing socket 600 according to the third embodiment having the oval shaped coils 161 to 164.

Further, each modified example of each embodiment in this specification may be used in any one of the above-described embodiments of the present invention.

The present invention has been described in connection with the preferred embodiments. The invention is not limited only to the above embodiments. It is apparent that various modifications, improvements, combinations, and the like can be made by those skilled in the art.

What are claimed are:

1. A method for testing a magnetic sensor, comprising the steps of:
   (a) contacting a probe card to a wafer on which a magnetic sensor is formed;
   (b) impressing a magnetic field to the magnetic sensor by supplying current to a plurality of coils formed in the probe card;
   (c) detecting an output signal of the magnetic sensor by the probe card; and
   (d) changing a direction of the magnetic field impressed to the magnetic sensor by changing the current supplied to the plurality of the coils.

2. A method for testing a magnetic sensor module, comprising the steps of:
   (a) contacting at least one of magnetic sensor modules formed on a wafer, each magnetic sensor having a magnetic sensor and a digital signal processor, with a probe card having a coil for impressing a magnetic field to the magnetic sensor;
   (b) testing the digital signal processor by inputting a testing signal to the digital signal processor via the probe card and by obtaining a response signal corresponding to the testing signal from the digital signal processor via the probe card;
   (c) testing the magnetic sensor by supplying current to the coil for impressing a magnetic field to the magnetic sensor and obtaining a response signal from the magnetic sensor module via the probe card; and
   (d) separating the magnetic sensor module from the probe card.

3. The method for testing a magnetic sensor module according to claim 2, wherein the step (a) positions the probe card to the magnetic sensor module in accordance with regular pattern formed on the wafer.

4. The method for testing a magnetic sensor module according to claim 2, wherein
   the step (a) contacts the probe card with a plurality of the magnetic sensor modules at a time, and
   the step (c) impresses the magnetic field generated by the current supply to the magnetic sensors of the plurality of the magnetic sensor modules.

5. The method for testing a magnetic sensor module according to claim 2, further comprising the step of (e) storing a correction value of the magnetic sensor to a storage device of the magnetic sensor module by inputting the correction value of the magnetic sensor corresponding to a result of the test at the step (c) to the magnetic sensor module via the probe card.

6. A method for testing a magnetic sensor module, comprising the steps of:
   (a) enclosing a packaged magnetic sensor module having a magnetic sensor and a digital signal processor into a testing socket having a coil for impressing a magnetic field to the magnetic sensor;
   (b) testing the digital signal processor by inputting a testing signal to the digital signal processor via the testing socket and by obtaining a response signal corresponding to the testing signal from the digital signal processor via the testing socket;
   (c) testing the magnetic sensor by supplying current to the coil for impressing a magnetic field to the magnetic sensor and obtaining a response signal from the magnetic sensor module via the testing socket; and
   (d) removing the packaged magnetic sensor module from the testing socket.

* * * * *